(12) United States Patent
Murayama et al.

(10) Patent No.: US 7,122,886 B2
(45) Date of Patent: Oct. 17, 2006

(54) SEMICONDUCTOR MODULE AND METHOD FOR MOUNTING THE SAME

(75) Inventors: Rina Murayama, Tenri (JP); Tomotoshi Sato, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 10/985,848

(22) Filed: Nov. 10, 2004

(65) Prior Publication Data

US 2005/0116330 A1 Jun. 2, 2005

(30) Foreign Application Priority Data

Nov. 11, 2003 (JP) ............................ P2003-381343

(51) Int. Cl.
*H01L 23/02* (2006.01)
(52) U.S. Cl. ...................... 257/686; 257/777
(58) Field of Classification Search ........ 257/686–691, 257/700, 777–780, 685, 720; 361/627, 749, 361/825
See application file for complete search history.

(56) References Cited

U.S. PATENT DOCUMENTS

| | | | |
|---|---|---|---|
| 5,432,823 A | | 7/1995 | Gasbarro et al. |
| 5,448,511 A | * | 9/1995 | Paurus et al. ............... 365/52 |
| 6,121,676 A | | 9/2000 | Solberg |
| 6,208,521 B1 | | 3/2001 | Nakatsuka |
| 6,225,688 B1 | | 5/2001 | Kim et al. |
| 6,486,544 B1 | * | 11/2002 | Hashimoto ................. 257/686 |
| 6,977,441 B1 | * | 12/2005 | Hashimoto ................. 257/777 |
| 2001/0011766 A1 | * | 8/2001 | Nishizawa et al. ......... 257/685 |
| 2004/0238931 A1 | * | 12/2004 | Haba et al. ................. 257/686 |
| 2005/0095745 A1 | * | 5/2005 | Sapir ......................... 438/106 |
| 2005/0280135 A1 | * | 12/2005 | Rapport et al. ............. 257/686 |

FOREIGN PATENT DOCUMENTS

| | | |
|---|---|---|
| JP | 6-69279 | 3/1994 |
| JP | 7-506920 | 7/1995 |
| JP | 11-40618 | 2/1999 |
| WO | WO 93/18463 | 9/1993 |

\* cited by examiner

*Primary Examiner*—Nathan W. Ha
(74) *Attorney, Agent, or Firm*—Peter J. Manus; David G. Conlin; Edwards Angell Palmer & Dodge LLP

(57) ABSTRACT

A semiconductor module that can realize a substantially fixed transmission time of signals transmitted through electric wirings disposed on a board via each semiconductor device mounted on a board and can reduce reflection of high-frequency signals and a method for mounting the same is provided. A plurality of semiconductor devices are mounted on a flexible board, and a semiconductor module is formed by folding the board so that the plurality of semiconductor devices are stacked. In an input signal line electrically and mechanically connected to each of the semiconductor devices and an output signal line electrically and mechanically connected to each of the semiconductor devices which signal lines are formed on the board, the sum of a first line length of the input signal line and a second line length of the output signal line for each of the semiconductor devices is set to a substantially fixed length.

5 Claims, 9 Drawing Sheets

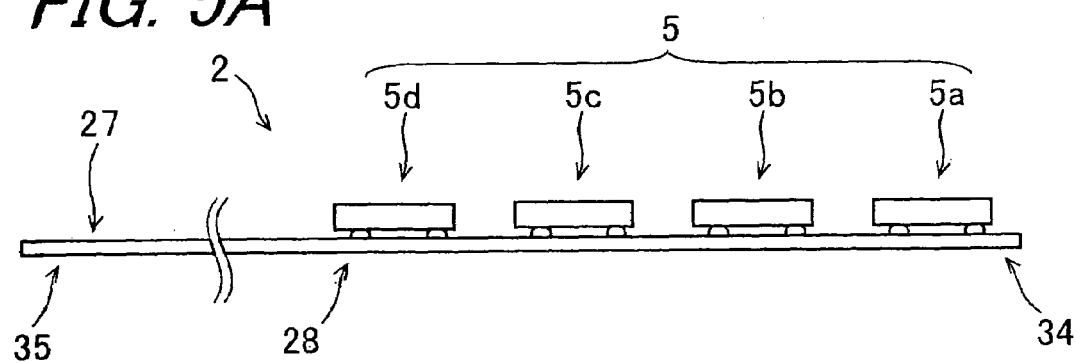
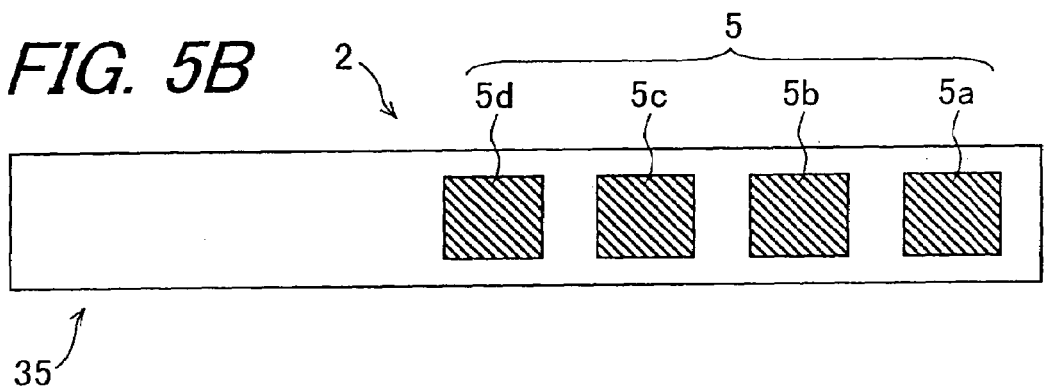
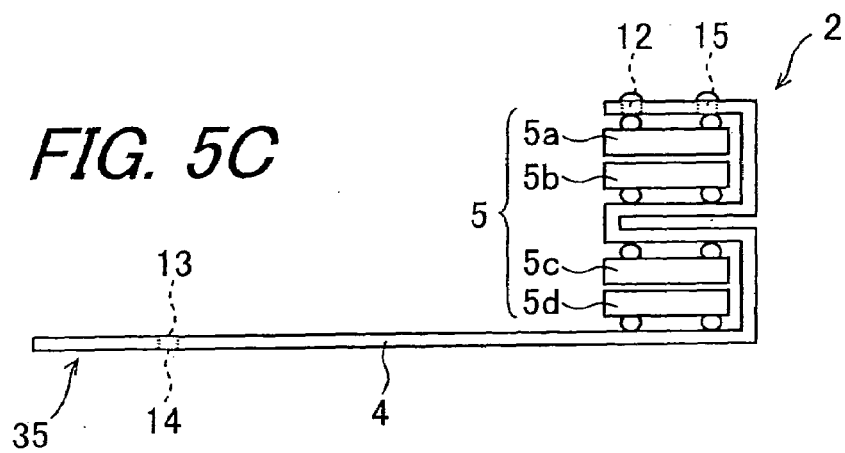

SEMICONDUCTOR MODULE AND METHOD FOR MOUNTING THE SAME

BACKGROUND OF THE INVENTION

1. Field of the Invention

The present invention relates to a semiconductor module and a method for mounting the same.

In the invention, a term 'a substantially fixed length' includes 'a fixed length.'

2. Description of the Related Art

In recent years, as miniaturization of mobile electronic equipment and mobile electronic apparatuses such as mobile telephones and mobile information terminals is requested, it is promoted to miniaturize semiconductor modules and increase the densities thereof. In order to promote miniaturization of the semiconductor modules in this way, a stacked-type semiconductor module structure such that a plurality of semiconductor devices are stacked is proposed. It is possible to realize the stacked-type semiconductor module by mounting the semiconductor devices on a flexible board and folding the board.

FIG. 6 is a cross sectional view of a mounting structure of a semiconductor module 100 of a first related art taken on a virtual plane including a board in a thickness direction thereof. FIG. 7 is a cross sectional view of the semiconductor module 100 in a developed state. FIG. 8 is a circuit view schematically showing a transmission circuit of the semiconductor module 100. The semiconductor module 100 of the first related art comprises a flexible wiring board 105 and four semiconductor devices 101.

On one surface portion of the wiring board 105, the four semiconductor devices 101 are mounted as shown in FIG. 7. Moreover, on the wiring board 105, an external connecting terminal 107 and printed wiring 106 are formed. The external connecting terminal 107 includes an external input terminal 107a to which signals are inputted and an external output terminal 107b that outputs signals. The printed wiring 106 electrically connects the external input terminal 107a and the external output terminal 107b to the respective semiconductor devices 101. Consequently, it is possible to transmit signals inputted to the external input terminal 107a to the respective semiconductor devices 101. Moreover, it is possible to transmit signals from the respective semiconductor devices 101 to the external output terminal via the printed wiring 106.

Further, since the wiring board 105 has flexibility, it is possible to fold the wiring board 105 so that the respective semiconductor devices 101 are stacked. By thus folding the wiring board 105, it is possible to form the semiconductor module 100. The semiconductor module 100 formed in this way has a mounting area approximately one quarter of a mounting area of a semiconductor module such that the four semiconductor devices 101 are mounted in the longitudinal direction without folding the wiring board 105 (refer to Japanese Unexamined Patent Publication JP-A 6-69279 (1994) (FIG. 1, pages 2 to 3) and United States Patent Publication U.S. Pat. No. 6,121,676 (FIG. 5, page 4), for example).

FIG. 9 is a plan view showing a stacked-type mounting body 110 of a second related art in a developed state. FIG. 10 is a simplified circuit view showing a transmission circuit of the stacked-type mounting body 110. The stacked-type mounting body 110 comprises a base element 111, four film carrier elements 112, and bending portions 113. The base element 111 and the four film carrier elements 112 are formed by substantially square insulating boards, and conducting lines 114 are disposed inside. Moreover, semiconductor devices can be mounted on the conducting lines 114 of the base element 111 and the four film carrier elements 112. The respective film carrier elements 112 of the base element 111 and the base element 111 are mechanically connected to each other at side face portions via the bending portions 113. Consequently, the stacked-type mounting body 110 is formed into a cross shape such that the base element 111 is placed in the center.

Further, the bending portion 113 are formed by flexible insulating boards. Consequently, it is possible to fold the bending portions 113 so that the four film carrier elements 112 are stacked on the base element 111, and form the stacked-type mounting body 110 such that the four film carrier elements 112 are stacked on the base element 111. Moreover, the conducting lines 114 are disposed inside the bending portions 113.

The conducting lines 114 of the respective film carrier elements 112 and the conducting lines 114 of the base element 111 are electrically connected via the conducting lines 114 of the bending portions 113. Consequently, it is possible to transmit signals between the respective film carrier elements 112 and the base element 111. Moreover, the conducting lines 114 are formed so that wiring lengths from the base element 111 to the respective film carrier elements 112 become a substantially fixed length.

In the stacked-type mounting body 110 formed in this way, the wiring lengths from the base element 111 to the respective film carrier elements 112 are a substantially fixed length. Therefore, in the case of transmitting the same signals from the base element 111 to the respective film carrier elements 112, the sum of a transmission time for transmitting signals from the base element 111 to each of the film carrier elements 112 and a transmission time for transmitting signals from each of the film carrier elements 112 to the base element 111 becomes a substantially fixed time. Consequently, it is possible to avoid a reading error that results from a difference in transmission times when the base element 111 reads signals transmitted from the respective film carrier elements 112 to the base element 111 (refer to Japanese Unexamined Patent Publication JP-A 11-40618 (1999) (FIG. 2, pages 3 to 4), for example).

FIG. 11 is a simplified circuit view showing a bus system 120 of a third related art. The bus system 120 comprises a master device 121, three slave devices 122, a data bus 123, a clock bus 124, and a clock 125.

To the master device 121 and the three slave devices 122 ('the master device 121 and the three slave devices 122' maybe referred to as 'the devices 129' hereinafter) the data bus 123 and the clock bus 124 are electrically connected. The devices 129 are capable of subjecting inputted signals to operation processing and outputting the signals.

The data bus 123 is capable of making signals inputted from one end portion thereof. To another end portion of the data bus 123, the master device 121 is electrically connected. Moreover, to a middle portion of the data bus 123, the slave devices 122 are electrically connected. When signals are inputted, the data bus 123 can transmit the signals to the respective devices 129. Moreover, the data bus 123 is capable of transmitting signals outputted from the respective devices 129 to the one end portion.

The clock bus 124 has first and second segments 126, 127 and a middle and vicinity portion 128. One end of the clock bus 124 is electrically connected to the clock 125. The clock bus 124 is folded at the middle and vicinity portion 128 of the whole length thereof. Of the clock bus 124, a side from the middle and vicinity portion 128 to a portion connected to the clock 125 is referred to as the first segment 126, and the rest is referred to as the second segment. The first segment 126 and the second segment 127 are electrically connected to the respective devices 129.

The clock 125 has a function of generating clock signals and transmitting the clock signals to the respective devices 129 via the clock bus 124.

The clock signals are inputted to the respective devices 129 via the clock bus 124. When the clock signals are inputted from the first segment 126 to the respective devices 129, the respective devices 129 receive signals inputted from the data bus 123. Moreover, when the clock signals are inputted from the second segment 127 to the respective devices 129, operated signals are outputted from the respective devices 129 to the data bus 123. Consequently, signals inputted to the respective devices 129 are not outputted until the clock signals are received from the second segment 127 after the devices 129 receive the clock signals from the first segment 126 and make the signals inputted. Therefore, in the respective devices 129, a time between input and output, that is, a transmission standby time is generated.

In the bus system 120, the data bus 123 and the clock bus 124 are formed so that the sum of a transmission standby time in each of the devices 129, a time for transmitting signals inputted to the data bus 123 to each of the devices 129, and a time for transmitting from each of the devices 129 to the one end of the data bus 123 becomes a substantially fixed time. Consequently, whichever one of the devices 129 signals inputted to the data bus 123 are transmitted through to the one end of the data bus 123, a transmission time becomes a substantially fixed time. The transmission time is synonymous with a time between input of signals to a device such as the data bus 123 and output from the device. Therefore, it is possible to minimize clock data skews of the respective devices 129 of the bus system 120 (refer to Japanese Published Unexamined Patent Application based on International Application JP-A 7-506920 (1995)(FIG. 3, pages 4 to 5)).

The semiconductor module 100 of the first related art is formed by folding the wiring board 105 and stacking the four semiconductor devices 101. On this occasion, regarding the printed wiring 106, the line lengths of the printed wiring 106 electrically connected to the external connecting terminal 107 vary depending on the respective semiconductor devices 101. Depending on whichever semiconductor device signals inputted from the external input terminal 107a are transmitted through to the external output terminal 107b, a transmission time is different. Consequently, a difference in times for transmitting signals outputted from the respective semiconductor devices 101 to the external output terminal 107b, that is, a transmission delay time is generated.

There is a case where the circuit board with the semiconductor module 100 mounted cannot read signals outputted from the external output terminal 107b, that is, a reading error occurs because of the transmission delay time. The reading error occurs when the transmission delay time exceeds a quarter of one cycle of inputted signals. Therefore, in order that the circuit board does not cause the reading error, the semiconductor module 100 needs to be formed so that the transmission delay time becomes a quarter or less of one cycle of inputted signals, and therefore, it is inconvenient.

Further, when the transmission delay time exceeds a quarter of one cycle of inputted signals, it is necessary to change timing for reading signals on the basis of the transmission delay time, so that there is a problem such that circuit designing is complicated.

In the stacked-type mounting body 110 of the second related art, the sum of a time for transmitting signals from the base element 111 to each of the film carrier elements 112 and a transmission time for transmitting signals from each of the film carrier elements 112 to the base element 111 becomes a substantially fixed time. Consequently, it is possible to inhibit occurrence of the reading error as in the semiconductor module 100 of the first related art, but it is necessary to input signals to the base element 111 once in the case of transmitting signals to the respective film carrier elements 112, and therefore, it is inconvenient. Moreover, in the case of mounting the base element 111 on the circuit board, it is easy to match the impedances of an output terminal, which is not shown in the drawings, of the base terminal 111 and the circuit board at the time of inputting signals, but it is difficult at the time of outputting. Consequently, in the case of transmitting high-frequency signals in the stacked-type mounting body 110, reflection of signals occurs on the circuit board, and signals are disturbed.

The bus system 120 of the third related art can eliminate a difference in transmission times of the respective devices 129 by clock signals transmitted from the clock 125. In this case, in the bus system 120, the transmission standby time is set so that transmission times of the respective devices 129 become substantially the same as the largest transmission time of the transmission times of the respective devices 129. In other words, the transmission times of the devices 129 are substantially the same as the transmission time of the master device 121 in specific. Therefore, the transmission times of the respective devices 129 become large, so that it is inconvenient. Moreover, it is necessary to dispose the data bus 123, the clock bus 124 and the clock 125, and therefore, the conducting circuit becomes complicated.

SUMMARY OF THE INVENTION

An object of the present invention is to provide a semiconductor module that can realize a substantially fixed transmission time of signals transmitted through electric wirings disposed on a board via each semiconductor device mounted on a board and can reduce reflection of high-frequency signals, and a method for mounting the same.

The invention provides a semiconductor module comprising:

a board provided with electric wirings including a input signal line and a output signal line; and a plurality of semiconductor devices mounted on the board, the input signal line being electrically and mechanically connected to each of the semiconductor devices mounted on the board, and the output signal line being electrically and mechanically connected to each of the semiconductor devices, a sum of a first line length of the input signal line and a second line length of the output signal line for each of the semiconductor devices being set to a substantially fixed length.

According to the invention, the semiconductor module includes the plurality of semiconductor devices, and the semiconductor devices are mounted on the board. Of the electric wiring, the input signal line is electrically and mechanically connected to each of the semiconductor devices. Consequently, it is possible to transmit signals inputted to the input signal line to each of the semiconductor devices. Of the electric wiring, the output signal line is electrically and mechanically connected to each of the semiconductor devices. Consequently, it is possible to transmit signals outputted from the respective semiconductor devices via the output signal line. Therefore, it is possible to output signals from the respective semiconductor devices by using the same wiring. Furthermore, the sum of the first line length of the input signal line and the second line length of the output signal line for each of the semiconductor devices is set to a substantially fixed length. Consequently, the sum of a time for transmitting signals to the semiconductor device via the input signal line and a time for transmitting signals from the semiconductor device via the output signal line can be substantially made fixed.

According to the invention, the sum of the first line length of the input signal line and the second line length of the output signal line for each of the semiconductor devices is set to a substantially fixed length. Therefore, whichever semiconductor device of the plurality of semiconductor devices signals are inputted to, the sum of a time for transmitting to a semiconductor device via the input signal line and a time for transmitting from the semiconductor devices via the output signal line is substantially the same. Consequently, a transmission delay time of signals depends on only processing times in the respective semiconductor devices. The transmission delay time is synonymous with a difference in transmission times among different semiconductor devices in the case of transmitting via the different semiconductor devices. Therefore, the semiconductor module of the invention can make the transmission delay time smaller than the conventional semiconductor modules.

As a result, it is possible to realize a convenient semiconductor module that is capable inhibiting occurrence of a reading error that results from the transmission delay time in reading signals outputted from the output signal line. Moreover, since occurrence of the reading error as mentioned before is inhibited, it is not necessary to design a complicated circuit that changes timing for reading signals. Accordingly, it is possible to simplify the circuit of the semiconductor module, and it is possible to promote reduction of the cost of manufacture.

Further, in the invention, the board is a flexible board that has flexibility and can be folded; and the board is further provided with internal connecting means for electrically connecting a pair of electrodes to be placed on the flexible board to each other.

According to the invention, since the board is a flexible board that has flexibility and can be folded, it is possible to fold the board with the flexibility. On the board, the pair of electrodes electrically connected to the input signal line and the output signal line are placed. Therefore, it is possible to transmit signals inputted to one of the electrodes to the respective semiconductor devices. Moreover, it is possible to transmit signals outputted from the respective semiconductor devices to the other electrode. Furthermore, the board is further provided with the internal connecting means for electrically connecting the pair of electrodes to each other. Consequently, it is possible to transmit signals inputted to at least one of the pair of electrodes to the other electrode.

According to the invention, it is possible to fold the board. Consequently, it is possible to make a mounting area of the semiconductor module smaller than a mounting area of a semiconductor module in an unfolded state. The mounting area is synonymous with the area of a surface facing a circuit board in the case of mounting the semiconductor module on the circuit board. Moreover, for example, by stacking a plurality of semiconductor devices and thereby forming a stacked-type semiconductor module, it is possible to reduce the mounting area.

Further, the pair of electrodes are electrically connected to each other by the internal connecting means. Consequently, it is possible to transmit signals inputted to at least one of the pair of electrodes to the other electrode. Therefore, for example, in forming the stacked-type semiconductor module as mentioned before, it is possible to electrically connect the pair of electrodes to each other via the internal connecting means in specific. Thus, it is possible to electrically connect the pair of electrodes with ease.

Still further, in the invention, the board has:

mounting input terminals for inputting signals to the semiconductor devices;

mounting output terminals to which signals are outputted from the semiconductor devices;

a first input terminal disposed on one surface portion of the board;

a second input terminal disposed on another surface portion of the board, the second input terminal being electrically connected to the first input terminal via the internal connecting means;

a third input terminal that is disposed on the board and that penetrates through the board in a thickness direction thereof to be electrically connected to the second input terminal; and an output terminal disposed on the board, wherein the first line length of the input signal line is a wiring length from the third input terminal to the mounting input terminal through the second input terminal and the first input terminal, and the second line length of the output signal line is a wiring length from the mounting output terminal to the output terminal.

According to the invention, the board is provided with the mounting input terminal, the mounting output terminal, the first input terminal, the second input terminal, the third input terminal, and the output terminal. The first line length of the input signal line is a wiring length from the third input terminal to the mounting input terminal via the second input terminal and the first input terminal. The second line length of the output signal line is a wiring length from the mounting output terminal to the output terminal. Moreover, signals can be inputted into a semiconductor module from the third input terminal. Furthermore, the semiconductor module can output signals from the output terminal. Therefore, signals inputted from the third input terminal are guided to the respective semiconductor devices via the second input terminal, the first input terminal, and the mounting input terminal. Moreover, signals outputted from the semiconductor devices are guided to the output terminal via the mounting output terminal. Besides, the sum of the first line length and the second line length for each of the semiconductor devices is set to a substantially fixed length. Therefore, the sum of a time for guiding signals inputted to the third input terminal to each of the semiconductor devices and a time for guiding signals outputted from each of the semiconductor devices to the output terminal can be substantially made fixed.

According to the invention, the sum of a wiring length from the third input terminal to each of the semiconductor devices and a wiring length from the aforementioned semiconductor device to the output terminal is set to a substantially fixed length. Therefore, the sum of a time for transmitting signals inputted to the third input terminal to each of the semiconductor devices via the input signal line and a time for transmitting signals outputted from each of the semiconductor devices via the output signal line becomes substantially the same in whichever semiconductor device. Here, 'substantially the same' includes 'the same.' Consequently, the transmission delay time of the respective semiconductor devices depends on only a difference in processing times in the respective semiconductor devices. Therefore, the semiconductor module of the invention is capable of making the transmission delay time to be shorter than the conventional semiconductor modules. As a result, it is possible to realize a convenient semiconductor module that is capable of inhibiting occurrence of a reading error resulting from the transmission delay time at the time of reading signals outputted from the output signal line. Moreover, in order to inhibit occurrence of the reading error as mentioned before, there is no need to design a complicated circuit for changing a time interval to read signals.

Still further, in the invention, the semiconductor module further comprises terminating resistance means electrically and mechanically connected to the input signal line and the output signal line, respectively, the terminating resistance means being capable of reducing reflection of signals.

According to the invention, the terminating resistance means is electrically and mechanically connected to the input signal line and the output signal line, respectively. Consequently, it is possible to reduce reflection of signals at termination portions of the input signal line and the output signal line.

According to the invention, it is possible to reduce reflection of signals occurring at the respective termination portions of the input signal line and the output signal line. In specific, it is possible to reduce reflection of signals that outstandingly occurs at the time of transmitting high-frequency signals to the respective semiconductor devices. Consequently, it is possible to inhibit high-frequency signals from being disturbed by reflected signals at the time of transmitting high-frequency signals with the input signal line and the output signal line.

Still further, in the invention, the third input terminal and the output terminal are formed so that they can be mounted on a circuit board via external connecting means.

According to the invention, the third input terminal and the output terminal are formed so that they can be mounted on the circuit board via the external connecting means. Consequently, it is possible to electrically connect the third input terminal and the output terminal on the circuit board via the external connecting means. Therefore, it is possible to input signals to the third input terminal from the circuit board. Moreover, it is possible to output signals from the output terminal to the circuit board.

According to the invention, it is possible to electrically connect the circuit board and the third input terminal via the external connecting means. Therefore, it is possible to transmit signals from the circuit board to the respective semiconductor devices via the external connecting means. Moreover, it is possible to electrically connect the circuit board and the output terminal via the external connecting means. Therefore, it is possible to output signals from the respective semiconductor devices to the circuit board via the external connecting means. Thus, a convenient semiconductor module can be realized.

Still further, the invention provides a method for mounting a semiconductor module, comprising:
a mounting step of mounting a plurality of semiconductor devices on a flexible board that can be folded; and
a folding step of folding the flexible board in a manner that of electric wirings including an input signal line which is electrically and mechanically connected to each of the semiconductor devices mounted on the flexible board and an output signal line which is electrically and mechanically connected to each of the semiconductor devices, the input signal line and the output signal line being disposed in the flexible board, a sum of a first line length of the input signal line and a second line length of the output signal line for each of the semiconductor devices becomes a substantially fixed length.

According to the invention, in the mounting step, the plurality of semiconductor devices are mounted on the flexible board. In the folding step, the board is folded. At the time of folding the flexible board in the folding step, the board is folded so that the sum of the first line length of the input signal line and the second line length of the output signal line for each of the semiconductor device becomes a substantially fixed length. By going through these steps, it is possible to realize a semiconductor module such that the plurality of semiconductor devices are mounted on the board and the first line length of the input signal line where each of the semiconductor devices is electrically and mechanically connected and the second line length of the output signal line is a substantially fixed length.

Still further, in the invention, the method further comprises a circuit board mounting step of mounting the semiconductor module on a circuit board after the folding step.

According to the invention, in the circuit board mounting step, it is possible to mount the semiconductor module on the circuit board. Consequently, it is possible to realize mounting of a semiconductor module such that the first line lengths of the input signal line and the second line lengths of the output signal line are a substantially fixed length, on the circuit board.

BRIEF DESCRIPTION OF THE DRAWINGS

Other and further objects, features, and advantages of the invention will be more explicit from the following detailed description taken with reference to the drawings wherein:

FIGS. 5A to 5C are views showing a procedure of mounting semiconductor devices 5a to 5d on a board and folding the board in stages;

DETAILED DESCRIPTION

Figure 1:
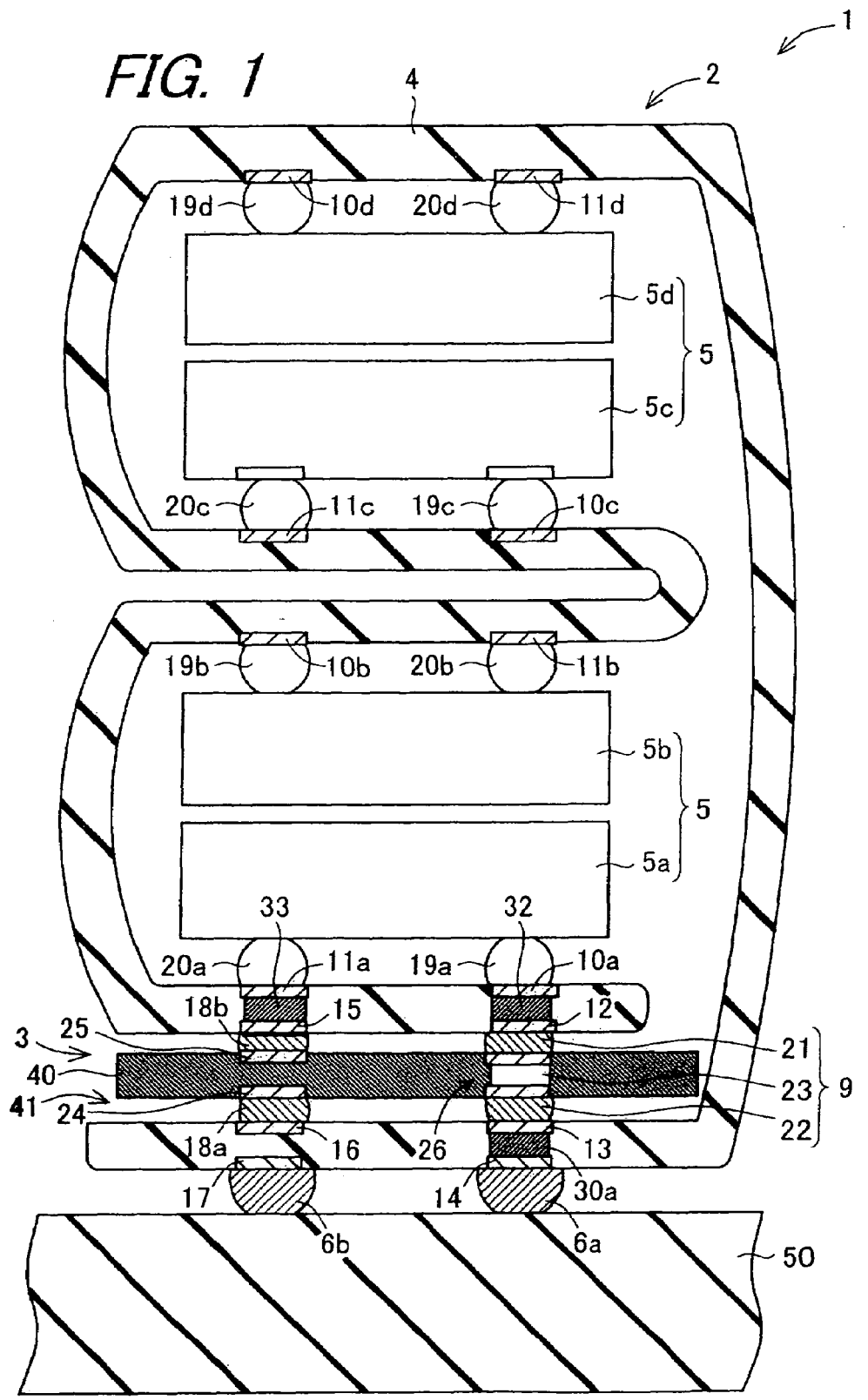
FIG. 1 is a cross sectional view showing a semiconductor module according to an embodiment of the present invention by cutting on a virtual plane including a circuit board in a thickness direction thereof.

Now referring to the drawings, preferred embodiments of the invention are described below.

Figure 2:
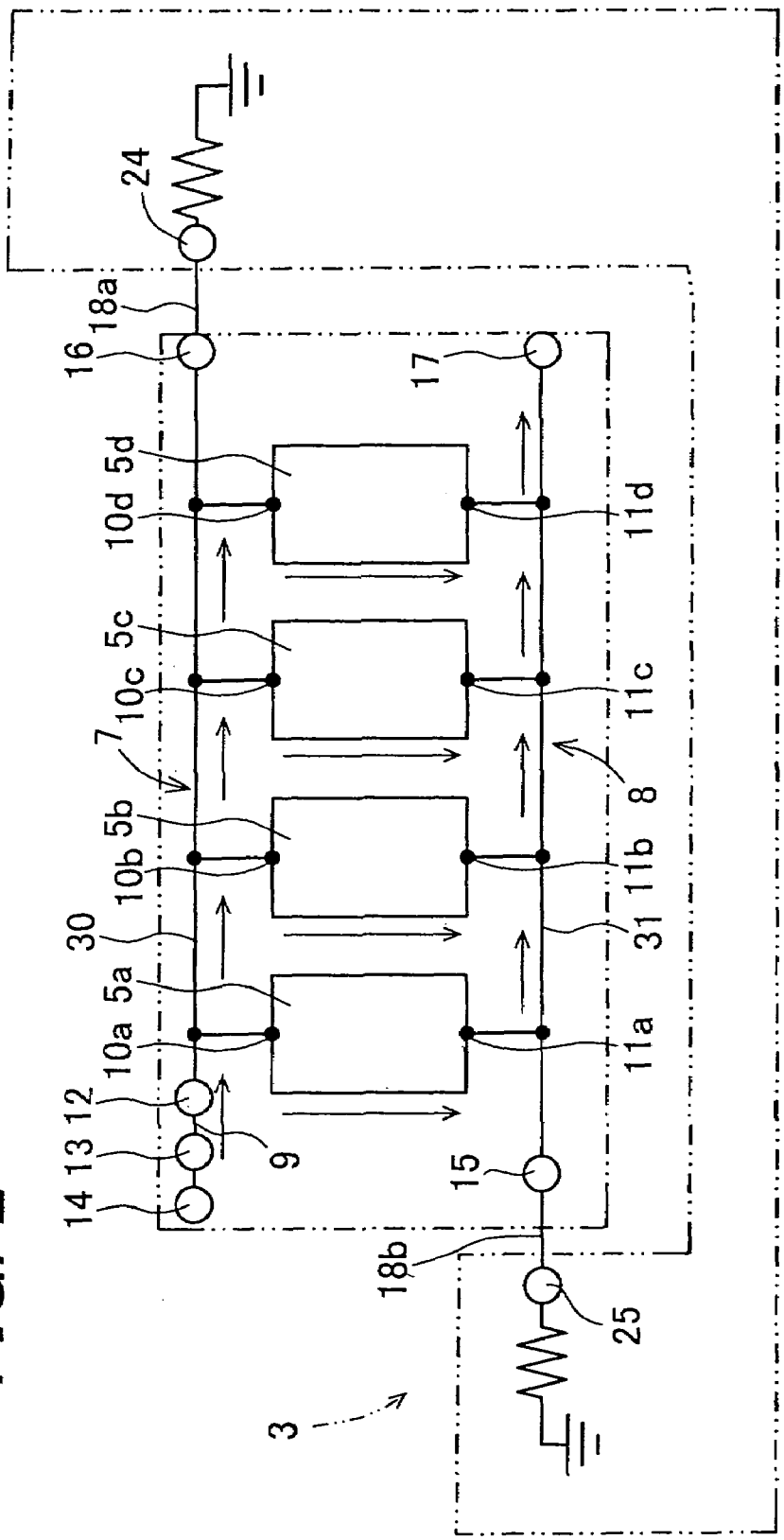
FIG. 2 is a simplified circuit view showing a transmission circuit of the semiconductor module.
Figure 3:
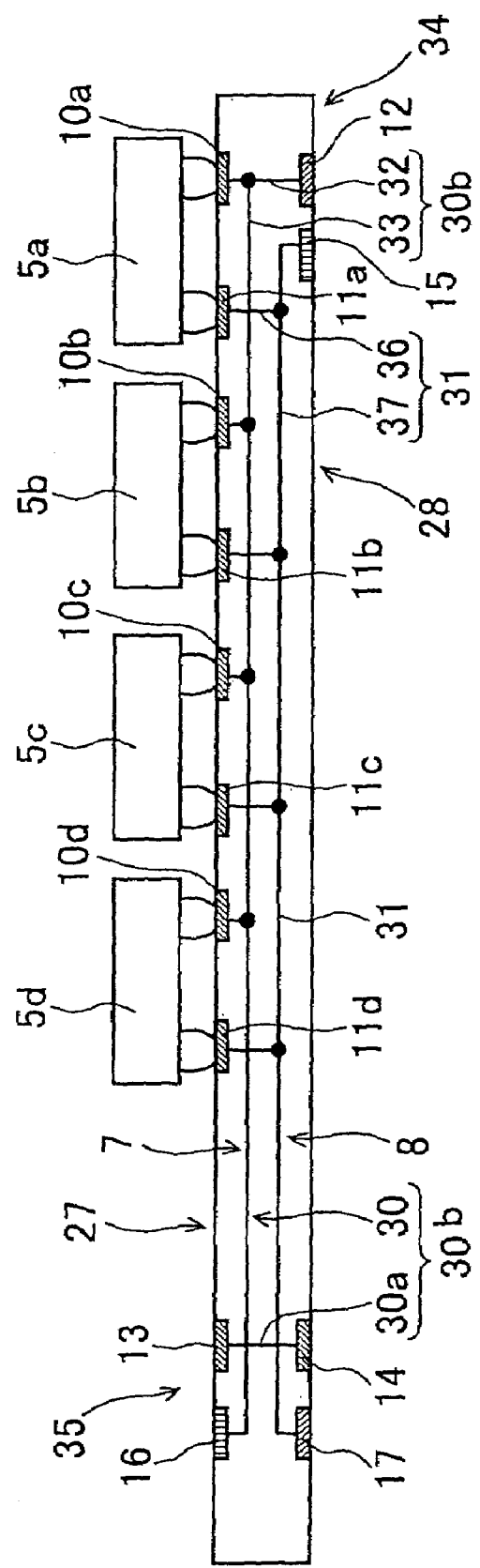
FIG. 3 is a simplified circuit view showing the transmission circuit inside the semiconductor module in a developed state.

FIG. 1 is a cross sectional view showing a semiconductor module 1 according to an embodiment of the present invention by cutting on a virtual plane including a circuit board 50 in a thickness direction thereof. FIG. 2 is a simplified circuit view showing a transmission circuit of the semiconductor module 1. FIG. 3 is a simplified circuit view showing the transmission circuit inside the semiconductor module 1 in a developed state. The semiconductor module 1 is mounted on a circuit board 50 placed inside electronic equipment such as a personal computer. To the semiconductor module 1, signals are inputted from the circuit board 50. Moreover, the semiconductor module 1 executes operation processing on the basis of the signals and stores information based on the inputted signals. Furthermore, the semiconductor module 1 is capable of outputting signals based on information obtained in operation processing and the stored information to the circuit, board 50. The semiconductor module 1 comprises a semiconductor module main body 2 and terminating resistance means 3 in the main.

The semiconductor module main body 2 comprises a plurality of semiconductor devices 5, a board 4, and external connecting means 6. The semiconductor module main body 2 is formed so that the board 4 is folded in order to stack the plurality of semiconductor devices 5. Consequently, in the case of mounting the semiconductor module main body 2 on the circuit board 50, it is possible to make a mounting area thereof smaller than a mounting area of a conventional semiconductor module that is not a stacked-type. In this embodiment, a case where the semiconductor module main body 2 comprises four semiconductor devices 5 will be described.

In the following description of the structure of the semiconductor module 1, the semiconductor module 1 in a developed state as shown in FIG. 3 will be described. Here, the developed state is synonymous with a state where the semiconductor module main body 2 with the board 4 folded as shown in FIG. 1 is developed.

In specific, the four semiconductor devices 5 are a first semiconductor device 5a, a second semiconductor device 5b, a third semiconductor device 5c, and a fourth semiconductor device 5d. The respective semiconductor devices 5a to 5d are capable of executing operation processing on the basis of inputted signals and storing the inputted signals. Moreover, the respective semiconductor devices 5a to 5d are capable of outputting signals obtained in operation processing and the stored signals. The respective semiconductor devices 5a to 5d are memory chips, for example. Furthermore, it is preferred that the respective semiconductor devices 5a to 5d have a thin-type mounting structure like a bare chip and a wafer level CSP. On one surface portions of the respective semiconductor devices 5a to 5d, input-side bumps 19 and output-side bumps 20 are disposed in an isolated state at a specified distance. The respective semiconductor devices 5a to 5d can be mounted on the board 4 via the input-side bumps 19 and the output-side bumps 20.

The input-side bumps 19 are formed so as to protrude specified short distances from the one surface portions of the respective semiconductor devices 5a to 5d. Moreover, the input-side bumps 19 are formed so that the respective semiconductor devices 5a to 5d can be mounted on the board 4. The input-side bumps 19 are formed by the use of one selected from among solder alloy of tin-silver-copper, tin plating, copper plating and gold plating, for example.

Describing in detail, in this embodiment, the input-side bumps 19 include a first input-side bump 19a, a second input-side bump 19b, a third input-side bump 19c, and a fourth input-side bump 19d. The first input-side bump 19a is placed on the one surface portion of the first semiconductor device 5a. The second input-side bump 19b is placed on the one surface portion of the second semiconductor device 5b. The third input-side bump 19c is placed on the one surface portion of the third semiconductor device 5c. The fourth input-side bump 19d is placed on the one surface portion of the fourth semiconductor device 5d.

The output-side bumps 20 are formed so as to protrude specified short distances from the one surface portions of the respective semiconductor devices 5a to 5d. The output-side bumps 20 are formed so that the respective semiconductor devices 5a to 5d can be mounted on the board 4. Moreover, the output-side bumps 20 are electrically connected to the respective semiconductor devices 5a to 5d. The output-side bumps 20 are formed by the use of one selected from among solder alloy of tin-silver-copper, tin plating, copper plating and gold plating, for example.

Describing in detail, in this embodiment, the output-side bumps 20 include a first output-side bump 20a, a second output-side bump 20b, a third output-side bump 20c, and a fourth output-side bump 20d. The first output-side bump 20a is placed on the one surface portion of the first semiconductor device 5a. The second output-side bump 20b is placed on the one surface portion of the second semiconductor device 5b. The third output-side bump 20c is placed on the one surface portion of the third semiconductor device 5c. The fourth output-side bump 20d is placed on the one surface portion of the fourth semiconductor device 5d.

The board 4 is a substantially rectangularly shaped flexible wiring board that has an insulation property. Therefore, the board 4 can be folded. Consequently, it is possible to reduce a mounting area of the semiconductor module 1. The board 4 can be realized by a flexible print circuit (abbreviated as FPC) produced by using polyimide as a material, for example. The board 4 is provided with an input signal line 7 and an output signal line 8, which are electrical wirings and have electrical conductivity. The thickness of the board 4 is desired to be 50 μm or more and 200 μm or less, and specifically desired to be 100 μm.

The input signal line 7 comprises a plurality of mounting input terminals 10, a first input terminal 12, a second input terminal 13, a third input terminal 14, an input-side termination terminal 16, an input conducting path 30, and internal connecting means 9. The input signal line 7 is realized by a transmission line structure like a microstrip line and a coplanar transmission line, for example. In this embodiment, the input signal line 7 includes four mounting input terminals 10.

The four mounting input terminals 10 are made of an electrically conductive material, and are placed on one surface portion 27 of the board 4 in a longitudinal direction thereof. The four mounting input terminals 10 are formed so that the input-side bumps 19 of the respective semiconductor devices 5a to 5d can be mounted.

In specific, the four mounting input terminals 19 are a first mounting input terminal 10a, a second mounting input terminal 10b, a third mounting input terminal 10c, and a fourth mounting input terminal 10d. The respective mounting input terminals 10a to 10d are placed side by side on the one surface portion 27 of the board 4 in the longitudinal direction. Moreover, the respective mounting input terminals 10a to 10d are placed side by side on the one surface portion 27 of the board in a state where each of the mounting input terminals 10a to 10d is isolated from an adjacent one of the mounting input terminals 10a to 10d at a specified distance.

Describing in detail, the first mounting input terminal 10a is disposed in a position isolated from one end at a specified short distance on the one surface portion 27 of one end portion 34 of the board 4. Here, the one end portion 34 of the board 4 is synonymous with one end portion in the longitudinal direction of the board 4. The fourth mounting input terminal 10d is disposed in a position isolated from another end of the board 4 at a specified long distance on the one surface portion 27 of the board 4. The other end of the board 4 is synonymous with an end different from the one end in the longitudinal direction of the board 4, that is, synonymous with the other end in the longitudinal direction of the board 4. The second mounting input terminal 10b is disposed between the first mounting input terminal 10a and the fourth mounting input terminal 10d. Moreover, the third mounting input terminal 10c is disposed between the second mounting terminal 10b and the fourth mounting input terminal 10d.

The first input terminal 12, which is a first input terminal, is made of an electrically conductive material, and is placed on another surface portion 28 at the one end portion 34 of the board 4. The other surface portion 28 is synonymous with a surface portion on the rear side of the one surface portion 27 of the board 4. In specific, the first input terminal 12 is placed on the other surface portion 28 so as to face the first mounting input terminal 10a via the board 4.

The second input terminal 13, which is a second input terminal, is made of an electrically conductive material, and is placed on the one surface portion 27 at another end portion 35 of the board 4. The other end portion 35 of the board 4 is synonymous with the other end portion in the longitudinal direction of the board 4. In specific, the second input terminal 13 is placed in a position isolated from the other end of the board 4 at a specified distance.

The third input terminal 14, which is third inputting means, is made of an electrically conductive material, and is placed on the other surface portion 28 at the other end portion 35 of the board 4. In specific, the third input terminal 14 is placed on the other surface portion 28 so as to face the second input terminal 13 via the board 4. Moreover, the third input terminal 14 is electrically connected to input-side external connecting means 6a that will be described later.

The input-side termination terminal 16 is made of an electrically conductive material, and is placed on the other surface portion 28 at the other end portion 35 of the board 4. In specific, the input-side termination terminal 16 is placed between the other end of the board 4 and the second input terminal 13. To the input-side termination terminal 16, the terminating resistance means 3 is electrically connected.

The input conducting path 30 is disposed on the one surface portion 27 and an internal portion of the board 4. The input conducting path 30 includes a first input conducting path 30a and a second input conducting path 30b. The input conducting path 30 is made of an electrically conductive material, and can be realized by copper foil, for example.

The first input conducting path 30a is formed at the other end portion 35 of the board 4 so that it penetrates through the board 4 in a thickness direction thereof as shown in FIG. 3. The first input conducting path 30a is formed so that one end is electrically and mechanically connected to the second input terminal 13 and the other end is electrically and mechanically connected to the third input terminal 14. In other words, the second input terminal 13 and the third input terminal 14 are electrically connected via the first input conducting path 30a.

The second input conducting path 30b includes an input-side through-conducting portion 32 and an input-side surface conducting portion 33. The input-side through-conducting portion 32 is formed at the one end portion 34 of the board so as to penetrate through the board 4 in the thickness direction as shown in FIG. 3. The input-side through-conducting portion 32 is formed so that one end is electrically and mechanically connected to the first input terminal 12 and the other end is electrically and mechanically connected to the first mounting input terminal 10a. In other words, the first input terminal 12 and the first mounting input terminal 10a are electrically connected via the input-side through-conducting portion 32.

The input-side surface conducting portion 33 is formed so that one end is electrically connected to a middle portion of the input-side through-conducting portion 32 and the other end is electrically connected to the input-side termination terminal 16. Moreover, the second mounting input terminal 10b, the third mounting input terminal 10c and the fourth mounting input terminal 10d are electrically connected to a middle portion of the input-side surface conducting portion 33. In other words, the input-side through-conducting portion 32, the second mounting input terminal 10b, the third mounting input terminal 10c, the fourth mounting input terminal 10d and the input-side termination terminal 16 are electrically connected via the input-side surface conducting portion 33.

In this way, it is possible to electrically connect the first input terminal 12, the first, second, third and fourth mounting input terminals 10a, 10b, 10c and 10d, and the input-side termination terminal 16 via the second input conducting path 30b.

The internal connecting means 9 comprises a first internal connecting electrode 21, a second internal connecting electrode 22, and an internal connecting conducting path 23. The internal connecting means 9 is formed by stacking in a state where the internal connecting conducting path 23 is sandwiched between the first internal connecting electrode 21 and the second internal connecting electrode 22. The internal connecting means 9 is formed so as to be capable of electrically connecting the first input terminal 12 and the second input terminal 13 in a state where the board 4 is folded. Here, the state where the board 4 is folded is synonymous with a state where the board 4 is folded so that the other surface portion 28 of the one end portion 34 of the board 4 faces the one surface portion 27 of the other end portion 35 of the board 4 and the first input terminal 12 faces the second input terminal 13.

The first internal connecting electrode 21 is made of an electrically conductive material, and is capable of electrically connecting the first input terminal 12 and the internal connecting conducting path 23 in a state where the board 4 is folded. The second internal connecting electrode 22 is made of an electrically conductive material, and is capable of electrically connecting the second input terminal 13 and the internal connecting conducting path 23 in a state where the board 4 is folded.

The internal connecting conducting path 23 is made of an electrically conductive material, and is capable of connecting the first internal connecting electrode 21 and the second internal connecting electrode 22. Moreover, the internal connecting conducting path 23 is formed so that it can be inserted into a termination resistance board through hole portion 26 formed on the termination resistance board 3 that will be described later.

Thus, the input signal line 7 is formed so that the third input terminal 14, the first, second, third and fourth mounting input terminals 10a, 10b, 10c and 10d, and the input-side termination terminal 16 are electrically connected via the input conducting path 30 and the internal connecting means 9.

The output signal line 8 comprises a plurality of mounting output terminals 11, an output terminal 17, an output-side termination terminal 15, and an output conducting path 31. The output signal line 8 is realized by a transmission line structure like a microstrip line and a coplanar transmission line, for example. In this embodiment, the output signal line 8 includes four mounting output terminals 11.

The four mounting output terminals 11 are made of an electrically conductive material, and are placed side by side on the one surface portion 27 of the board 4 in the longitudinal direction. The four mounting output terminals 11 are formed so that the output-side bumps 20 of the respective semiconductor devices 5a to 5d can be mounted.

In specific, the four mounting output terminals 11 are a first mounting output terminal 11a, a second mounting output terminal 11b, a third mounting output terminal 11c, and a fourth mounting output terminal 11d. The respective mounting output terminals 11a to 11d are placed side by side in the longitudinal direction on the one surface portion 27 of the board 4. Moreover, the first mounting output terminal 11a is placed between the first mounting input terminal 10a and the second mounting input terminal 10b. The second mounting output terminal 11b is placed between the second mounting input terminal 10b and the third mounting input terminal 10c. The third mounting output terminal 11c is placed between the third mounting input terminal 10c and the fourth mounting input terminal 10d. The fourth mounting output terminal 11d is placed between the fourth mounting input terminal 10d and the other end of the board 4.

Describing in detail, the first mounting output terminal 11a is disposed in a position such that the first output-side bump 20a can be mounted in a case where the first input-side bump 19a is mounted on the first mounting input terminal 10a. The second mounting output terminal 11b is disposed in a position such that the second output-side bump 20b can be mounted in a case where the second input-side bump 19b is mounted on the second mounting input terminal 10b. The third mounting output terminal 11c is disposed in a position such that the third output-side bump 20c can be mounted in a case where the third input-side bump 19c is mounted on the third mounting input terminal 10c. The fourth mounting output terminal 11d is disposed in a position such that the fourth output-side bump 20d can be mounted in a case where the fourth input-side bump 19d is mounted on the fourth mounting input terminal 10d.

As a result, it is possible to realize mounting of the respective semiconductor devices 5a to 5d on the board 4 via the respective mounting output terminals 11a to 11d and the aforementioned respective mounting input terminals 10a to 10d.

The output terminal 17 is made of an electrically conductive material, and is placed on the other surface portion 28 at the other end portion 35 of the board 4. In specific, the output terminal 17 is placed between the third input terminal 14 and the other end of the board 4 so as to face the input-side termination terminal 16 via the board 4. Moreover, the output terminal 17 is electrically connected to output-side external connecting means 6b that will be described later.

The output-side termination terminal 15 is made of an electrically conductive material, and is placed on the other surface portion 28 at the one end portion 34 of the board 4. In specific, the output-side termination terminal 15 is placed so as to face the first mounting output terminal 11a via the board 4. Moreover, the output-side termination terminal 15 is electrically connected to the terminating resistance means 3.

The output conducting path 31 is disposed in the one surface portion 27 and an internal portion of the board 4. The output conducting path 31 includes an output-side through-conducting portion 36 and an output-side surface conducting portion 37. The output conducting path 31 is made of an electrically conductive material, and can be realized by copper foil, for example.

The output-side through-conducting portion 36 is formed at the one end portion 34 of the board 4 so as to penetrate through the board 4 in the thickness direction. The output-side through-conducting portion 36 is formed in a manner that one end is electrically connected to the first mounting output terminal 11a and the other end is electrically connected to the output-side termination terminal 15. In other words, the mounting output terminal 11a and the output-side termination terminal 15 are electrically connected via the output-side through-conducting portion 36.

The output-side surface conducting portion 37 is formed so that one end thereof is electrically connected to a middle portion of the output-side through-conducting portion 36 and the other end thereof is electrically connected to the output terminal 17. Moreover, the second mounting output terminal 11b, the third mounting output terminal 11c and the fourth mounting output terminal 11d are electrically connected to a middle portion of the output-side surface conducting portion 37. In other words, it is possible to electrically connect the output-side through-conducting portion 36, the second mounting output terminal 11b, the third mounting output terminal 11c, the fourth mounting output terminal 11d and the output terminal 17 via the output-side surface conducting portion 37.

Thus, it is possible to electrically connect the first mounting output terminal 11a, the second mounting output terminal 11b, the third mounting output terminal 11c, the fourth mounting output terminal 11d, the output-side termination terminal 15 and the output terminal 17 via the output conducting path 31.

In this way, the output signal line 8 is structured so that the first mounting output terminal 11a, the second mounting output terminal 11b, the third mounting output terminal 11c, the fourth mounting output terminal 11d, the output-side termination terminal 15 and the output terminal 17 are electrically connected mutually via the output conducting path 31.

Further, the input signal line 7 and the output signal line 8 are formed so that the sum of an input wiring length of the input signal line 7 of each of the semiconductor devices 5a to 5d and an output wiring length of the output signal line 8 of the aforementioned one of the semiconductor devices 5a to 5d becomes a substantially fixed length. The input wiring length of the input signal line 7, which is a first line length, is a wiring length from the third input terminal 14 to each of the mounting input terminals 10a to 10d via the input conducting path 30 and the internal connecting means 9. Moreover, the output wiring length of the output signal line

8 is a wiring length from each of the mounting output terminals 11a to 11d to the output terminal 17 via the output conducting path 31.

Describing in specific, the input signal line 7 and the output signal line 8 are formed so that the sum of a first input wiring length L11 and a first output wiring length L21, the sum of a second input wiring length L12 and a second output wiring length L22, the sum of a third input wiring length L13 and a third output wiring length L23, and the sum of a fourth input wiring length L14 and a fourth wiring length L24 become a substantially fixed length.

Here, the first input wiring length L11 is an input wiring length from the third input terminal 14 to the first mounting input terminal 10a. The first output wiring length L21 is an output wiring length from the first mounting output terminal 11a to the output terminal 17.

The second input wiring length L12 is an input wiring length from the third input terminal 14 to the second mounting input terminal 10b. The second output wiring length L22 is an output wiring length from the second mounting output terminal 11b to the output terminal 17.

The third input wiring length L13 is an input wiring length from the third input terminal 14 to the third mounting input terminal 10c. The third output wiring length L23 is an output wiring length from the third mounting output terminal 11c to the output terminal 17.

The fourth input wiring length L14 is an input wiring length from the third input terminal 14 to the fourth mounting input terminal 10d. The fourth output wiring length L24 is an output wiring length from the fourth mounting output terminal 11d to the output terminal 17.

Thus, it is possible to realize the input signal line 7 and the output signal line 8 such that the sum of the input wiring length and the output wiring length of each of the semiconductor devices 5a to 5d becomes a substantially fixed length. Moreover, it is possible to realize the board 4 provided with the input signal line 7 and the output signal line 8 as described above.

The external connecting means 6, which is a pair of electrodes, includes the input-side external connecting means 6a and the output-side external connecting means 6b.

The input-side external connecting means 6a is made of an electrically conductive material, and placed on the other surface portion 28 at the other end portion 35 of the board 4 so as to be electrically and mechanically connected to the third input terminal 14. Moreover, the input-side external connecting means 6a is formed so that it can be mounted on the circuit board 50 by protruding a specified short distance from the other surface portion 28 of the board 4. The input-side external connecting means 6a is a so-called bump, and is formed by the use of solder alloy of tin-silver-copper, tin plating, copper plating and gold plating, for example.

The output-side external connecting means 6b is made of an electrically conductive material, and placed on the other surface portion 28 at the other end portion 35 of the board 4 so as to be electrically and mechanically connected to the output terminal 17. Moreover, the output-side external connecting means 6b is formed so that it can be mounted on the circuit board 50 by protruding a specified short distance from the other surface portion 28 of the board 4. The output-side external connecting means 6b is at so-called bump, and is formed by the use of solder alloy of tin-silver-copper, tin plating, copper plating and gold plating, for example.

In this way, the external connecting means 6 is formed, and enables mounting of the semiconductor module main body 2 on the circuit board 50.

The terminating resistance means 3 comprises a termination resistance board 40 and termination resistance connecting means 18.

The termination resistance board 40 is a board having a resistive element formed into a substantially rectangular shape. The termination resistance board 40 is used for reducing reflection of signals at an conducting termination portion. Reduction of reflection of signals can be realized, for example, by matching the characteristic impedances of the input signal line 7 and the output signal line 8 with the impedance of the termination resistance board 40, that is, by executing impedance matching. The termination resistance board 40 is provided with an input-side termination resistance terminal 24 and an output-side termination resistance terminal 25, and a termination resistance board through hole 26 is formed.

The input-side termination resistance terminal 24 is made of an electrically conductive material, and placed on one surface portion at one end portion of the termination resistance board 40. The one end portion of the termination resistance board 40 is synonymous with one end portion of the termination resistance board 40 in a longitudinal direction thereof. The input-side termination resistance terminal 24 can be electrically connected to the termination resistance connecting means 18.

The output-side termination resistance terminal 25 is made of an electrically conductive material, and placed on another surface portion at the one end portion of the termination resistance board 40. Here, the other surface portion of the termination resistance board 40 is synonymous with a surface portion on the rear face of the one surface of the termination resistance board 40. The output-side termination resistance terminal 25 can be electrically connected to the termination resistance connecting means 18.

The termination resistance board through hole portion 26 is formed at another end portion of the termination resistance board 40. The other end portion of the termination resistance board 40 is synonymous with an end portion different from the one end portion in the longitudinal direction. In the termination resistance board through hole portion 26, a through hole that penetrates through the termination resistance board 40 in the thickness direction is formed. The termination resistance board through hole portion 26 is formed so that the internal connecting conducting path 23 can be inserted as described before.

The termination resistance connecting means 18 includes input-side termination resistance connecting means 18a and output-side termination resistance connecting means 18b. The termination resistance connecting means 18 is made of an electrically conductive material, and is capable of electrically connecting the termination resistance board 40 to the input signal line 7 and the output signal line 8.

The input-side termination resistance connecting means 18a is made of an electrically conductive material, and electrically and mechanically connected to the input-side termination resistance terminal 24 disposed on the termination resistance board 40. Moreover, the input-side termination resistance connecting means 18a is formed so that it can be electrically connected to the input-side termination terminal 16 in a state where the board 4 is folded.

The output-side termination resistance connecting means 18b is made of an electrically conductive material, and electrically and mechanically connected to the output-side termination resistance terminal 25 disposed on the termination resistance board 40. Moreover, the output-side termination resistance connecting means 18b is formed so that it can be electrically connected to the output-side termination terminal 15 in a state where the board 4 is folded.

The circuit board 50 is a printed wiring board, and the semiconductor module 1 can be mounted on a surface portion thereof via the external connecting means 6. When the semiconductor module 1 is mounted on the circuit board 50, signals can be inputted from the circuit board 50 to the semiconductor module 1. Moreover, signals can be outputted from the semiconductor module 1 to the circuit board 50.

Next, the stacked semiconductor module 1 will be described.

The board 4 in a developed state is folded so that another surface portion of the first semiconductor device 5a faces another surface portion of the second semiconductor device 5b between the first mounting output terminal 11a and the second mounting input terminal 10b. The other surface portions of the respective semiconductor devices 5a to 5d are synonymous with surface portions on the rear side of the one surface portions where the input-side bumps 19 and the output-side bumps 20 are disposed. In order to fold the board 4 in this way, the first mounting output terminal 11a and the second mounting input terminal 10b are disposed on the board 4 so as to be isolated from each other at least at a distance more than a first isolation distance. The first isolation distance is the sum of the thickness of the first semiconductor device 5a, the thickness of the second semiconductor device 5b, the thickness of the first input-side bump 19a, and the thickness of the second input-side bump 19b. Consequently, it becomes possible to fold the board 4 so that the other surface portion of the first semiconductor device 5a and the other surface portion of the second semiconductor device 5b face each other as described before.

Further, the board 4 is folded so that the other surface portions 28 of the board 4 face each other between the second mounting output terminal 11b and the third mounting input terminal 10c. Here, in order to maintain a state where the other surface portions 28 of the board 4 face each other, the facing other surface portions 28 of the board 4 may be firmly adhered by the use of an adhesive or the like. In order to fold the board 4 in this way, the second mounting output terminal 11b and the third mounting input terminal 10c are disposed on the board 4 so as to be isolated from each other at least at a distance such that the board 4 can be folded.

Furthermore, the board 4 is folded so that the other surface portion of the third semiconductor device 5c and the other surface portion of the fourth semiconductor device 5d face each other between the third mounting output terminal 11c and the fourth mounting input terminal 10d. In order to fold the board 4 in this way, the third mounting output terminal 11c and the fourth mounting input terminal 10d are disposed on the board 4 so as to be isolated from each other at least at a distance more than a second isolation distance. The second isolation distance is the sum of the thickness of the third semiconductor device 5c, the thickness of the fourth semiconductor device 5d, the thickness of the third input-side bump 19c, and the thickness of the third input-side bump 19d. Consequently, it is possible to fold the board 4 so that the other surface portion of the third semiconductor device 5c and the other surface portion of the fourth semiconductor device 5d face each other as described before.

Still further, the board 4 is folded so that the other surface portion 29 at the one end portion 34 of the board 4 and the one surface portion 28 at the other end portion 35 of the board 35 face each other via a resistor inserting portion 41 between the fourth mounting output terminal 11d and the second input terminal 13. The resistor inserting portion 41 is a space formed so that the termination resistance board 40 can be inserted.

Describing in specific, the board 4 is folded so that the first input terminal 12 and the second input terminal 13 face each other via the resistor inserting portion 41. The resistor inserting portion 41 is a space for inserting the termination resistance board 40. In order to fold the board 4 in this way, the fourth mounting output terminal 11d and the second input terminal 13 are disposed on the board 4 so as to be isolated at least at a distance more than a third isolation distance. Here, the third isolation distance is the sum of the thickness of the four semiconductor devices 5, the thickness of the three boards 4, and the thickness of the termination resistance board 40. By folding the board 4 in this way, it is possible to fold so that the first input terminal 12 and the second input terminal 13 face each other.

The first input terminal 12 and the second input terminal 13 are electrically and mechanically connected by the internal connecting means 9 so as to face each other.

Thus, it is possible to realize the semiconductor module main body 2 such that the four semiconductor devices 5 are stacked and the first input terminal 12 and the second input terminal are electrically and mechanically connected. Moreover, because the four semiconductor devices 5 are stacked, it is possible to make a mounting area thereof smaller than a mounting area in a state where the four semiconductor devices 5 are placed side by side.

Furthermore, in the semiconductor module main body 2, the termination resistance board 40 is inserted into the resistor inserting portion 41. On this occasion, the input-side termination resistance terminal 24 disposed on the termination resistor 40 is electrically connected to the input-side termination terminal 16 via the input-side termination resistance connecting means 18a. Moreover, the output-side termination resistance terminal 25 disposed on the termination resistor 40 is electrically connected to the output-side termination terminal 15 via the output-side termination resistance connecting means 18b. Besides, the internal connecting means 9 is inserted into the termination resistance board through hole portion 26 as described before.

Thus, it is possible to simultaneously realize electrical connection of the first input terminal 12 and the second input terminal 13. Moreover, the input signal line 7 and the output signal line 8 can be electrically connected to the termination resistance board 40.

In this way, it is possible to realize the semiconductor module 1 such that the semiconductor devices 5a to 5d are stacked and electrically connected to the termination resistance board 40.

The semiconductor module 1 is mounted on the circuit board 50 via the external connecting terminals 6. Consequently, signals are inputted from the circuit board 50 to the semiconductor module 1 via the input-side external connecting means 6a. The signals inputted to the input-side external connecting means 6a are transmitted to the first input terminal 12 via the third input terminal 14, the first input conducting portion 30a, the second input terminal, and the internal connecting means 9.

The signals transmitted to the first input terminal 12 are further transmitted to the first, second third and fourth mounting input terminals 10a, 10b, 10c and 10d and the input-side termination terminal 16 via the second input-side conducting portion 30b.

The signals transmitted to the first mounting input terminal 10a are inputted to the first semiconductor device 5a. The signals inputted to the first semiconductor device 5a are subjected to signal processing such as operation processing in the first semiconductor device 5a, and outputted to the first mounting output terminal 11a. The signals outputted to the first mounting output terminal 11a are transmitted to the output terminal 17 and the output-side termination terminal 15 via the output conducting path 31.

The signals transmitted to the second mounting input terminal 10b are inputted to the second semiconductor device 5b. The signals inputted to the second semiconductor device 5b are subjected to signal processing such as operation processing in the second semiconductor device 5b, and outputted to the second mounting output terminal 11b. The signals outputted to the second mounting output terminal 11b are transmitted to the output terminal 17 and the output-side termination terminal 15 via the output conducting path 31.

The signals transmitted to the third mounting input terminal 10c are inputted to the third semiconductor device 5c. The signals inputted to the third semiconductor device 5c are subjected to signal processing such as operation processing in the third semiconductor device 5c, and outputted to the third mounting output terminal 11c. The signals outputted to the third mounting output terminal 11c are transmitted to the output terminal 17 and the output-side termination terminal 15 via the output conducting path 31.

The signals transmitted to the fourth mounting input terminal 10d are inputted to the fourth semiconductor device 5d. The signals inputted to the fourth semiconductor device 5d are subjected to signal processing such as operation processing in the fourth semiconductor device 5d, and outputted to the fourth mounting output terminal 11d. The signals outputted to the fourth mounting output terminal 11d are transmitted to the output terminal 17 and the output-side termination terminal 15 via the output conducting path 31.

The signals transmitted to the output terminal are outputted to the circuit board 50 via the output-side external connecting means 6b. In this way, signals are inputted from the circuit board 50 to the semiconductor module 1, the inputted signals are processed in the respective semiconductor devices 5a to 5d, and the processed signals are outputted from the semiconductor module 1 to the circuit board 50.

Further, most of the signals transmitted to the input-side termination terminal 16 are transmitted to the termination resistance board 40 without reflected at the input-side termination terminal 16, because the impedances of the input-side termination terminal 16 and the termination resistance board 40 are matched. Therefore, it is possible to inhibit signals transmitted through the input signal line 7 from being synthesized with signals reflected at the input-side termination terminal 16. Consequently, it is possible to input accurate signals to the respective semiconductor devices 5a to 5d. As a result, it is possible to inhibit signals from being reflected at the input-side termination terminal 16.

Most of the signals transmitted to the output-side termination terminal 15 are transmitted to the termination resistance board 40 without being reflected at the output-side termination terminal 15, as well as at the input-side termination terminal 16. Therefore, it is possible to inhibit signals transmitted through the output signal line 8 from being synthesized with signals reflected at the output-side termination terminal 15. Consequently, accurate signals are outputted from the output-side external connecting means 6b. As a result, it is possible to inhibit signals from being reflected at the output-side termination terminal 15.

Thus, it is possible to inhibit reflection of signals at the termination portions of the input signal line 7 and the output signal line 8. Consequently, it is possible to input and output accurate signals even in the case of transmitting high-frequency signals to the semiconductor module 1.

Further, the semiconductor module 1 of this embodiment is formed so that the sum of the first input wiring length L11 and the first output wiring length L21, the sum of the second input wiring length L12 and the second output wiring length L22, the sum of the third input wiring length L13 and the third output wiring length L23, and the sum of the fourth input wiring length L14 and the fourth output wiring length L24 become a substantially fixed length. Moreover, signals inputted to the third input terminal 14 are transmitted to the respective semiconductor devices 5a to 5d via the same wiring. Furthermore, signals outputted from the respective semiconductor devices 5a to 5d are transmitted to the output terminal via the same wiring. Therefore, an input and output transmission time of proceeded signals for each of the semiconductor devices 5a to 5d can be substantially made fixed. Here, the input and output transmission time is the sum of a transmission time from the input-side external connecting means 6a to each of the mounting input terminals 10a to 10d and a transmission time from each of the mounting output terminals 11a to 11d to the output-side external connecting means 6b.

Accordingly, the input and output transmission times of proceeded signals in the respective semiconductor devices 5a to 5d are substantially the same, so that a transmission delay time of proceeded signals in each of the semiconductor devices 5a to 5d is only a difference in times for processing signals in the respective semiconductor devices 5a to 5d. Therefore, it is possible to make the transmission delay time small, and it is possible to inhibit a reading error from occurring when the circuit board 50 reads signals outputted from the output-side external connecting means 6a. The reading error is a state where, when outputted signals are read, the outputted signals cannot be read in a case where the transmission delay time is one quarter or more of a period of the outputted signals.

Further, since the transmission delay time is only a difference in times for processing signals in the respective semiconductor devices 5a to 5d, occurrence of the reading error due to a difference in frequencies of the signals is rare. Therefore, it is possible to realize the convenient semiconductor module 1 such that the frequencies of inputted signals are not limited.

Further, it is possible to shorten the transmission delay time of signals outputted to the output-side external connecting means 6b with the simple structure as described before. Moreover, even when the reading error occurs, it is possible to easily conclude that the cause of the occurrence of the reading error is a difference in times for processing signals in the respective semiconductor devices 5a to 5d. Consequently, it is possible to improve a condition of the occurrence of the reading error only by changing any one of the semiconductor devices 5a to 5d.

In particular, in a case where all the semiconductor devices 5a to 5d are the same semiconductor chips, times for processing signals become equal, and no transmission delay time is generated. Consequently, it is possible to prevent occurrence of the reading error, and it is possible to realize the more convenient semiconductor module 1.

Further, a transmission time in the semiconductor module 1 becomes shorter than a transmission time in the related art. It will be specifically described below that the transmission time becomes shorter, by comparing the semiconductor module 1 of this embodiment and the bus system 120 of the third related art.

A time that signals inputted to the third input terminal 14 are transmitted from the third input terminal 14 to the output terminal 17 via each of the semiconductor devices 5a to 5d in the semiconductor module 1 of this embodiment, is referred to as a semiconductor transmission time T. The semiconductor transmission time T includes an input transmission time t1, a signal processing time t2, and an output transmission time t3. Here, since the semiconductor transmission times T of the respective semiconductor devices 5a to 5d in the semiconductor module 1 are substantially the same, the semiconductor transmission time T of the fourth semiconductor device 5d will be simply referred to as the semiconductor transmission time T for convenience in the following description.

The input transmission time t1 is a time that signals inputted to the third input terminal 14 are transmitted from the third input terminal 14 to each of the semiconductor devices 5a to 5d. The signal processing time t2 is a time that each of the semiconductor devices 5a to 5d processes the inputted signals. The output transmission time t3 is a time that the signals processed by each of the semiconductor devices 5a to 5d are outputted from each of the semiconductor devices 5a to 5d and transmitted to the output terminal 17.

Further, a time that signals inputted to one end portion of the data bus 123 are transmitted from the one end portion and transmitted back to the one end portion via each of the devices 129 in the bus system 120 of the third related art, is referred to as a bus transmission time U. The bus transmission time U includes a bus input transmission time u1, a transmission standby time u2, and a bus output transmission time u3. Here, since the bus transmission times U of the respective devices 129 in the bus system 120 are substantially the same, the bus transmission time U of the master device 121 will be simply referred to as the bus transmission time U for convenience in the following description.

The bus input transmission time u1 is a time that signals inputted to the one end portion of the data bus 123 are transmitted from the one end portion to each of the devices 129. The transmission standby time u2 is a time from input to output of the signals inputted to each of the devices 129. In other words, the transmission standby time u2 includes a time for processing the inputted signals and a waiting time before the signals are outputted to the data bus 123. The bus output transmission time u3 is a time that the signals outputted from each of the devices 129 are transmitted from each of the devices 129 to the one end portion of the data bus 123.

As the respective semiconductor devices 5a to 5d and the respective devices 129, the same semiconductor chips or the like are used in order to simplify a description below. Moreover, a wiring length of the data bus 123 and the input wiring length of the input signal line 7 are made to be substantially the same. The wiring length of the data bus 123 is a wiring length from the one end portion of the data bus 123 to each of the devices 129. Comparison of the semiconductor transmission time T and the bus transmission time U in this case will be made.

Firstly, the input transmission time t1 and the bus input transmission time t2 will be compared. Since the wiring length of the data bus 123 and the input wiring length are made to be substantially the same, the input transmission time t1 and the bust input transmission time t2 become substantially the same.

Figure 11:
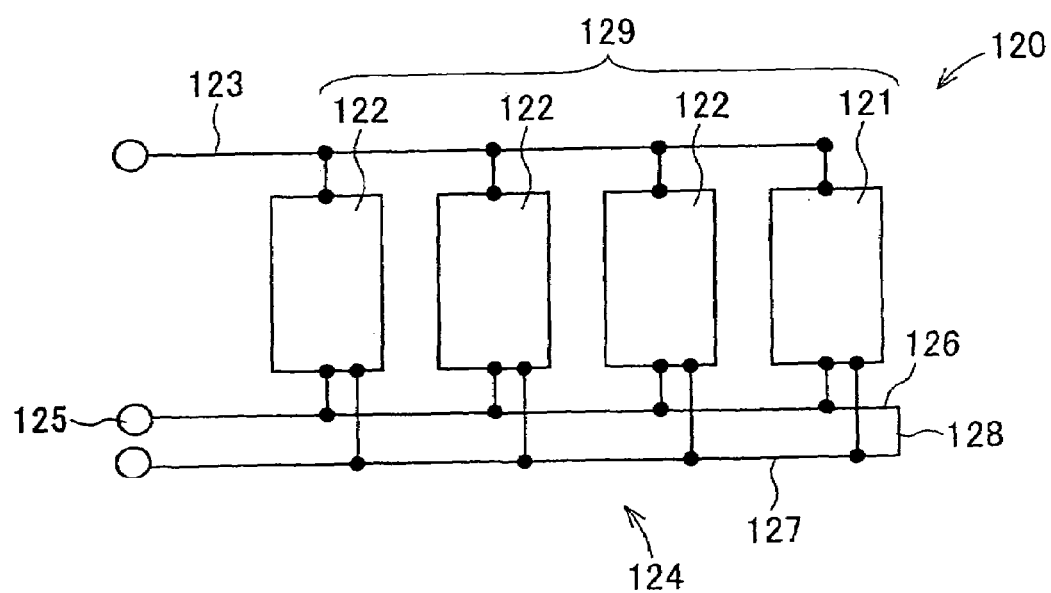
FIG. 11 is a simplified circuit view showing a bus system of a third related art.

Next, the signal processing time t2 and the transmission standby time u2 will be compared. Since the same semiconductor chips are used, times for processing signals in the fourth semiconductor device 5d and the master device 121 are the same. Moreover, the master device 121 is placed in the vicinity of the center of the clock bus 124 as shown in FIG. 11. Therefore, a time from reception of a clock signal from the first segment 126 to reception of a clock signal from the second segment 127 in the master device 121 is short. Accordingly, a waiting time in the master device 121 is short. Consequently, the signal processing time t2 and the transmission standby time u2 become a substantially the same time.

Finally, the output transmission time t3 and the bus output transmission time u3 will be compared. The output transmission time t3 is a time for transmission through the fourth output wiring length L24 of the output signal line 8. Since the wiring length of the data bus 123 is made to be substantially the same as the input wiring length of the input signal line 7, the bus output transmission time u3 is a time for transmission through the fourth input wiring length L14. Therefore, a difference in times between the output transmission time t3 and the bus output transmission time u3 is a difference between the time for transmission through the fourth output wiring length L24 and the time for transmission through the fourth input wiring length L14.

Accordingly, the input transmission time t1 and the bus input transmission time u1 become substantially the same, and the signal processing time t2 and the transmission standby time u2 become substantially the same, but the output transmission time t3 and the bus output transmission time u3 are different. This causes a difference in transmission times between the semiconductor transmission time T and the bus transmission time U. The difference in times is substantially the same as a difference in times between the output transmission time t3 and the bus output transmission time u3. Therefore, the difference between the semiconductor transmission time T and the bus transmission time u3 is proportion to a difference between the fourth output wiring length L24 and the fourth input wiring length L14 when the same signals are transmitted to the semiconductor module 1 and the data bus 120.

Here, for example, a difference between the semiconductor transmission time T in the following semiconductor module 1 and the bus transmission time U will be described. The board 4 is 100 μm in thickness. The respective semiconductor devices 5a to 5d mounted on the board 4 have a substantially square shape with a width of 1 cm, and are 200 μm in thickness. The respective semiconductor devices 5a to 5d are connected to the board 4 via the input-side bumps 19 and the output-side bumps 20 so that planes perpendicular to the thickness direction become perpendicular to the thickness direction of the board 4. The input-side bumps 19 and the output-side bumps 20 are 100 μm in thickness. Besides, the internal connecting means 9 is 900 μm in height.

Further, in the semiconductor module 1 formed in this way, the input signal line 7 is formed on the one surface portion of the board 4. Therefore, the fourth input wiring length L14 is substantially the same as a distance from the first mounting input terminal 10a to the fourth mounting input terminal 10d on the board 4, the thickness of the board 4, and the height of the internal connecting means 9. In other words, the fourth input wiring length L14 is equal to the sum of a dimension equivalent to the widths of three of the semiconductor devices 5a to 5d, the first isolation distance, the second isolation distance, the thickness of the board 4, and the thickness of the internal connecting means 9. Accordingly, the fourth input wiring length L14 is 32.2 mm.

The board 4 is folded so that the first input terminal 12 and the second input terminal 13 face each other as described before. Moreover, the output signal line 8 is formed on the one surface portion 27 of the board 4. Therefore, the fourth output wiring length L24 of the output signal line 8 is substantially the same as a distance from the fourth mounting output means 20d to the output terminal 17 on the board 4. In other words, the fourth output wiring length L24 is substantially the same as the third isolation distance and the widths of the respective semiconductor devices 5a to 5d. Therefore, the fourth output wiring length L24 is 12.6 mm.

Comparing the fourth input wiring length L14 and the fourth output wiring length L24, the fourth output wiring length is smaller. Therefore, the output transmission time t3 is shorter than the bus output transmission time u3. In other words, the semiconductor transmission time T is shorter than the bus transmission time U.

Thus, the semiconductor module 1 is capable of transmitting inputted signals to the respective semiconductor devices 5a to 5d and outputting the signals in a shorter time than the related art.

It is desired that the input impedances of the respective semiconductor devices 5a to 5d are sufficiently larger than the characteristic impedance of the input signal line 7. This is because it is possible to prevent the impedances from changing at the respective mounting input terminals 10a to 10d where the input signal line 7 and the respective semiconductor devices 5a to 5d are electrically connected. Consequently, it is possible to inhibit reflection of signals at connecting points.

It is desired that the output impedances of the respective semiconductor devices 5a to 5d are half of the characteristic impedance of the output signal line 8. Signals outputted from the respective semiconductor devices 5a to 5d are transmitted to the output terminal 17 and the output-side termination terminal 15 via the output signal line 8. That is, in the output signal line 8, a parallel circuit is formed by an output-terminal-side output signal line signal and a termination-terminal-side output signal line. The output-terminal-side output signal line is synonymous with a signal line that transmits signals outputted from the respective semiconductor devices 5a to 5d to the output terminal 17 in the output signal line 8. The termination-terminal-side output signal line is synonymous with a signal line that transmits signals outputted from the respective semiconductor devices 5a to 5d to the output-side termination terminal 15 in the output signal line 8. Consequently, the output impedances of the respective semiconductor devices 5a to 5d need to be matched with a composite impedance of the characteristic impedance of the output-terminal-side output signal line and the characteristic impedance of the termination-terminal-side output signal line. The characteristic impedance of the output-terminal-side output signal line and the characteristic impedance of the termination-terminal-side output signal line are equal to the characteristic impedance of the output signal line. Therefore, the composite impedance of the impedances of the output-terminal-side output signal line and the termination-terminal-side output signal line is half of the characteristic impedance of the output signal line. Accordingly, it is desired that the output impedances of the respective semiconductor devices 5a to 5d are half of the characteristic impedance of the output signal line 8. Moreover, it is desired that the output impedances of the respective semiconductor devices 5a to 5d are sufficiently larger than that of the output signal line 8 when the respective semiconductor devices 5a to 5d do not output, in consideration of the adjacent ones of the semiconductor devices 5a to 5d.

Figure 4:
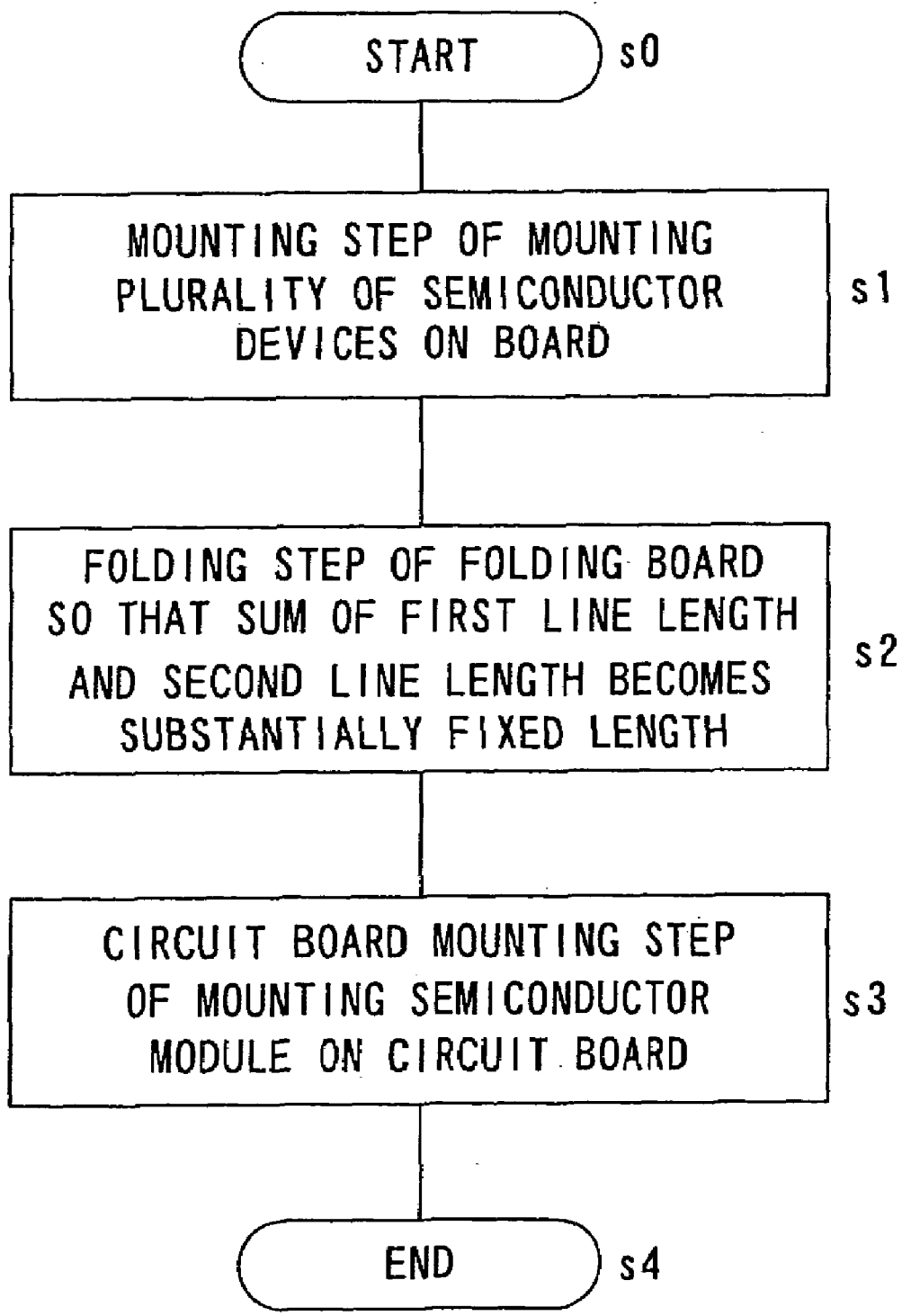
FIG. 4 is a flowchart showing a procedure of a method for mounting the semiconductor module
Figure 5D:
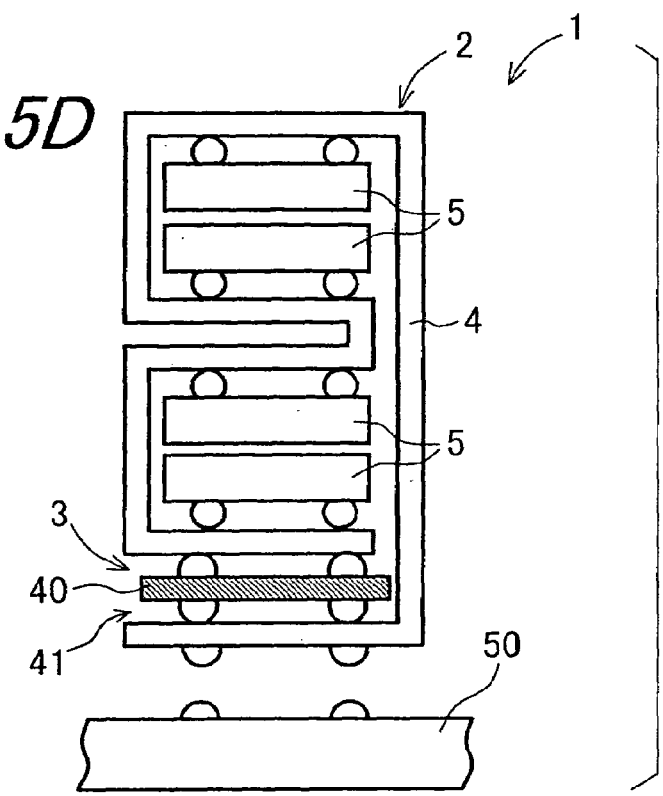
FIGS. 5D and 5E are views showing a procedure of providing a semiconductor module main body with a termination resistance board and mounting on the circuit board in stages.
Figure 5E:
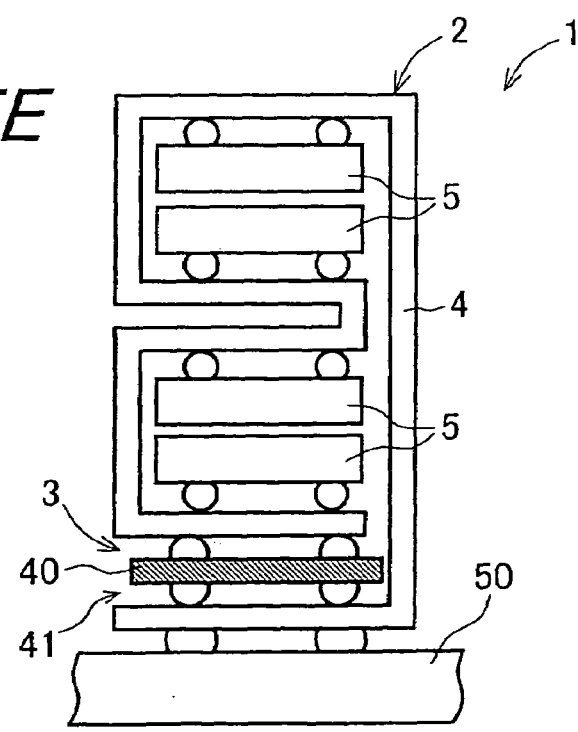
Figure 6:
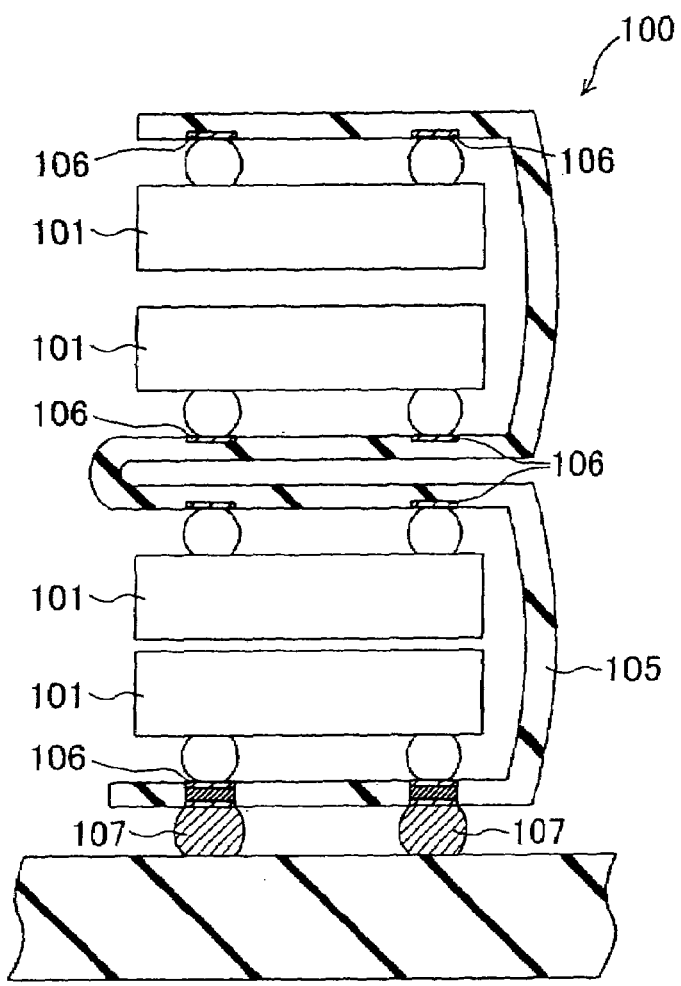
FIG. 6 is a cross sectional view showing a mounting structure of a semiconductor module of a first related art by cutting on a virtual plane including a board in a thickness direction thereof.
Figure 7:
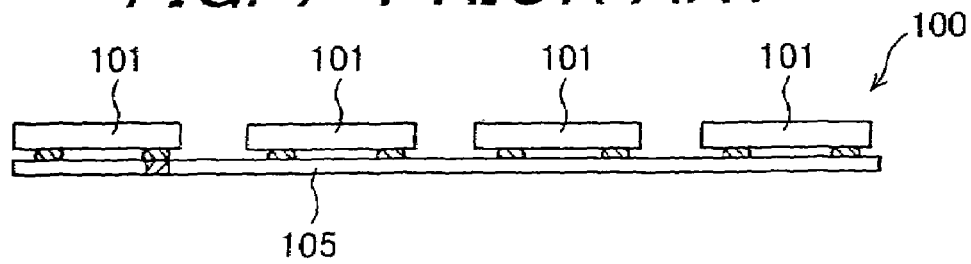
FIG. 7 is a cross sectional view showing the semiconductor module in a developed state.
Figure 8:
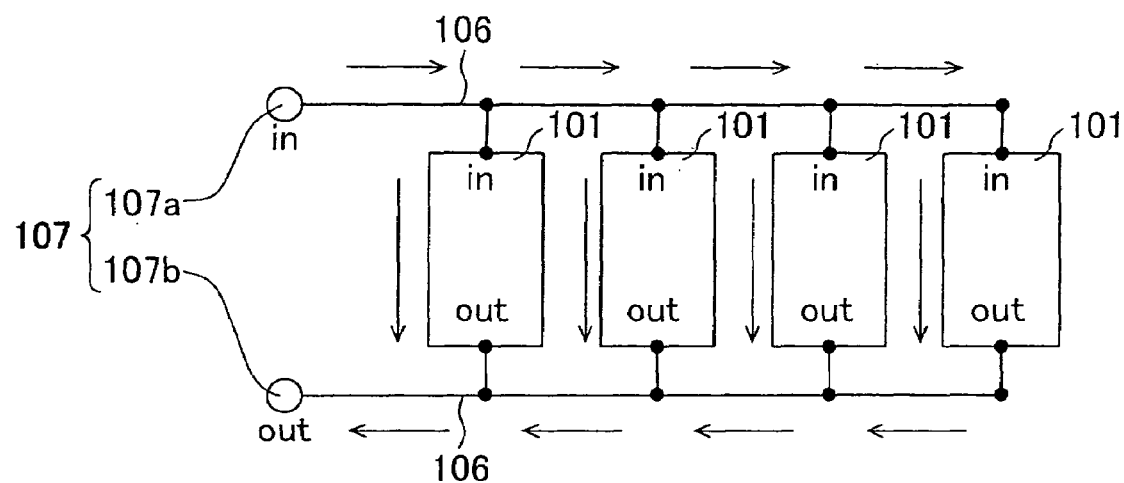
FIG. 8 is a simplified circuit view showing a transmission circuit of the semiconductor module.
Figure 9:
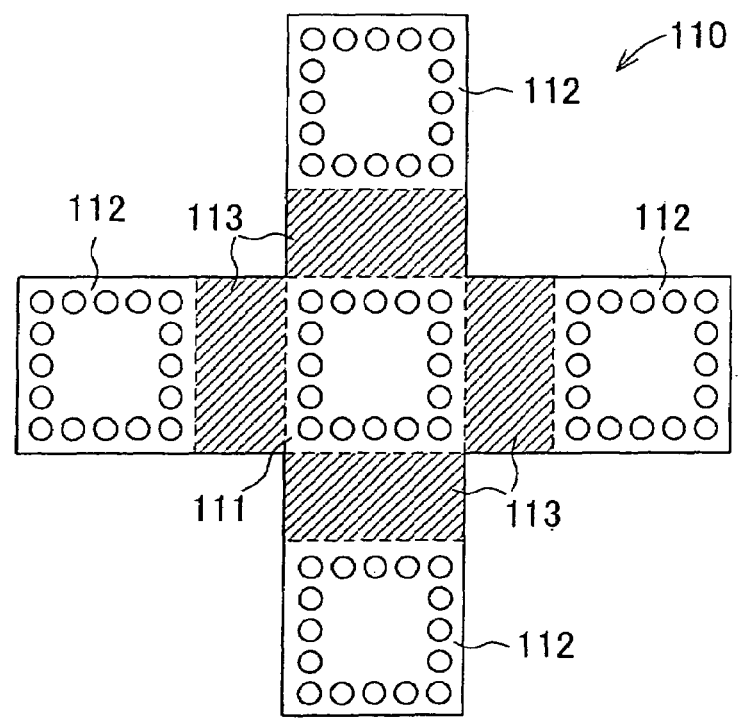
FIG. 9 is a plan view showing a stacked-type mounting body of a second related art in a developed state.
Figure 10:
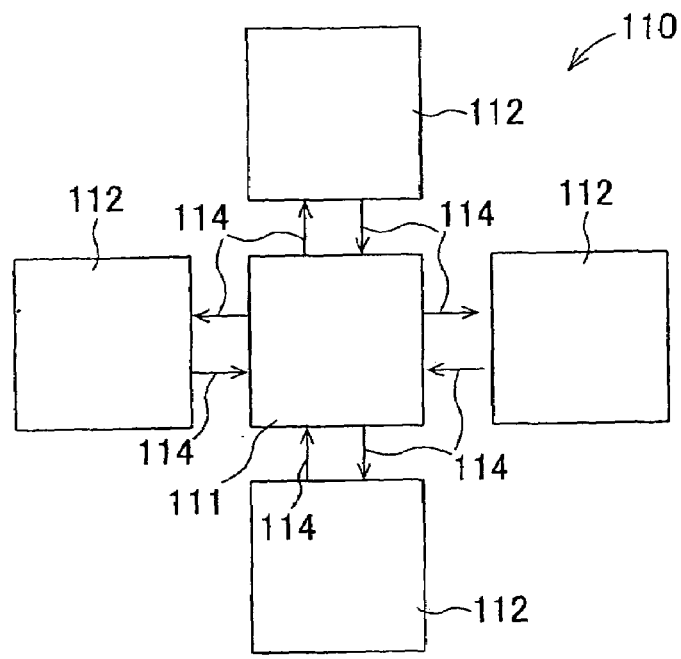
FIG. 10 is a simplified circuit view showing a transmission circuit of the stacked-type mounting body.

FIG. 4 is a flowchart showing a procedure of a method for mounting the semiconductor module 1. FIGS. 5A to 5C are views showing a procedure of mounting the respective semiconductor devices 5a to 5d on the board 4 and folding the board 4 in stages. FIGS. 5D and 5E are views showing a procedure of providing the semiconductor module main body 2 with the termination resistance board 40 and mounting on the circuit board 50 in stages. FIG. 5A is a side view of the semiconductor module main body 2 in a developed state. FIG. 5B is a view of the semiconductor module main body 2 in a developed state seen from a direction of mounting the respective semiconductor devices 5a to 5d. FIG. 5C is a side view of the semiconductor module main body 2 in a folded state. FIG. 5D is a view showing the semiconductor module main body 2 with the termination resistance board 40 inserted into the termination resistance board through hole portion 26. FIG. 5E is a view showing the semiconductor module 1 mounted on the circuit board 50.

The method for mounting the semiconductor module 1 includes a mounting step, a folding step, and a circuit board mounting step. The procedure starts at step S0, and goes to the step S1.

Step S1, which is the mounting step, is a step of mounting the first, second, third and fourth semiconductor devices 5a, 5b, 5c and 5d on the one surface portion 27 of the board 4 having a rectangular shape from one end of the board 4 so as to become parallel to the longitudinal direction as mentioned before as shown in FIGS. 5A and 5B.

Describing in detail, at step S1, the mounting input terminal 10, the mounting output terminal 11, the second input terminal 13 and the input-side termination terminal 16 are placed side by side in the longitudinal direction on the one surface portion 27 of the board 4 as mentioned before. Moreover, the first input terminal 12, the output-side termination terminal 15, the third input terminal and the output terminal 17 are placed side by side in the longitudinal direction on the other surface portion 28 of the board 4 as mentioned before.

Next, the input conducting path 30 and the output conducting path 31 are formed on the board 4. In specific, the first conducting path 30a, the input-side through-conducting portion 32 and the output-side through-conducting portion 36 are formed so as to penetrate through the board 4 in the thickness direction. Moreover, the input-side surface conducting portion 33 and the output-side surface conducting portion 37 are formed on the one surface portion 27 of the board 4. In this way, the electric wiring of the board 4 is formed.

Here, the input conducting path 30 and the output conducting path 31 are formed so that the sum of the first input wiring length L11 and the first output wiring length L21, the sum of the second input wiring length L12 and the second output wiring length L22, the sum of the third input wiring length L13 and the third output wiring length L23, and the sum of the fourth input wiring length L14 and the fourth output wiring length L24 become a substantially fixed length in a state where the board 4 is folded, in the folding step that will be described later.

Finally, the respective semiconductor devices 5a to 5d are mounted on the respective mounting input terminals 10a to 10d and the respective mounting output terminals 11a to 11d disposed on the board 4 via the input-side bumps 19 and the output-side bumps 20. In this embodiment, in specific, the first semiconductor device 5a is mounted on the first mounting input terminal 10a and the first mounting output terminal 11a. Moreover, the second semiconductor device 5b is mounted on the second mounting input terminal 10b and the second mounting output terminal 11b. The third semiconductor device 5c is mounted on the third mounting input terminal 10c and the third mounting output terminal 11c. The fourth semiconductor device 5d is mounted on the fourth mounting input terminal 10d and the fourth mounting output terminal 11d. In this way, the four semiconductor devices 5 are mounted on the board 4, and the procedure goes from step S1 to step S2.

At step S2, which is the folding step, as shown in FIGS. 5C and 5D, the board 4 is folded so that the sum of the input wiring length of the first line length and the output wiring length of the second line length become a substantially fixed length, and the termination resistance board 40 is inserted into the resistor inserting portion 41 formed on the semiconductor module main body 2.

Describing in detail, the board 4 is folded so that the sum of the first input wiring length L11 and the first output wiring length L21, the sum of the second input wiring length L12 and the second output wiring length L22, the sum of the third input wiring length L13 and the third output wiring length L23, and the sum of the fourth input wiring length L14 and the fourth output wiring length L24 become a substantially fixed length.

In this embodiment, the board A is folded so that the respective semiconductor devices 5a to 5d are stacked. In specific, as mentioned before, the board is folded so that the other surface portion of the first semiconductor device 5a faces the other surface portion of the second semiconductor device 5b and the other surface portion of the third semiconductor device 5c faces the other surface portion of the fourth semiconductor device 5d. Further, the board is folded so that the one surface portion of the second semiconductor device 5b faces the one surface portion of the third semiconductor device 5c via the board 4. Besides, the third input terminal 14 is electrically and mechanically connected to the external connecting means 6a. Moreover, the output terminal 17 is electrically and mechanically connected to the external connecting means 6b. In this way, the semiconductor module main body 2 such that the respective semiconductor devices 5a to 5d are stacked as shown in FIG. 5C is formed.

Next, as mentioned before, the board 4 is folded so that the second input terminal 13 formed on the other end portion 35 of the semiconductor module main body 2 and the first input terminal 12 face each other via the resistor inserting portion 41. In other words, the board 4 is folded so that the second input terminal 13 and the first input terminal 12 can be electrically and mechanically connected to the internal connecting means 9. Consequently, the four semiconductor devices 5 are stacked, and the semiconductor module main body 2 such that the sum of the first line length and the second line length in each of the semiconductor devices 5a to 5d is a fixed length is formed.

Finally, the resistance board 40 is inserted into the resistor inserting portion 41 of the semiconductor module main body 2. In specific, the board is inserted so that the internal connecting means 9 is inserted into the termination resistance board through hole portion 26. Moreover, the termination resistance board 40 is placed so that the input-side termination resistance terminal 24 is electrically connected to the input-side termination terminal 16 via the input-side termination resistance connecting means 18a and the output-side termination resistance terminal 24 is electrically connected to the output termination terminal 15 via the output-side termination resistance connecting means 18b. In this way, the termination resistance board 40 is inserted into the semiconductor module main body 2, whereby the semiconductor module 1 is formed.

In this way, the semiconductor module 1 is formed, and the procedure goes from step S2 to step S3.

At step S3, which is the circuit board mounting step, the semiconductor module 1 formed at step S2 is mounted on the circuit board 50 as shown in FIG. 5E. The semiconductor module 1 is mounted on the circuit board 50 via the external connecting means 6. When the semiconductor module 1 is thus mounted, the procedure goes from step S3 to step S4, and mounting is ended.

In this way, the method for mounting the semiconductor module 1 is realized. Consequently, it is possible to mount the semiconductor module 1 such that a mounting area is small and the sums of the input-side wiring lengths and the output-side wiring lengths in the respective semiconductor devices 5a to 5d are equal as mentioned before.

In a case where the respective semiconductor devices 5a to 5d are memory chips in this embodiment, such effects as described below will be taken. On this occasion, the input signal line 7 includes three signal lines of a control bus, an address bus and an input-side data bus, and the output signal line 8 includes an output-side data bus.

Here, the control bus is a signal line that transmits a control signal to the memory chip. The control signal is a signal for giving a command whether to cause the memory chip to store data or cause the memory chip to output information. The memory chip stores and outputs information on the basis of the control signal.

Further, the address bus is a signal line that transmits an address designation signal. The address designation signal is a signal for designating which address of the memory chip the command given by the control signal is executed by. The memory chip stores information into or outputs information from the designated address on the basis of the address designation signal. The input-side data bus transmits inputted information to the memory chip. The output-side data bus transmits a signal outputted from the memory chip to the output terminal 17.

When the control signal for causing the memory chip to store information is inputted to the control bus, it is possible to store information inputted to the input-side data bus to the address designated by the address designation signal. In this case, it is possible to transmit the control signal, the information and the address designation signal to each of the memory chips with the same input signal line 7, and therefore, high convenience is achieved.

Further, when the control signal for causing to output information is inputted to the control bus, the memory chip outputs information from the address designated by the address designation signal and transmits to the output terminal 17 via the output-side data bus. Consequently, whichever one of the memory chips information is outputted from, an information output time is substantially the same. The information output time is a time from input of the control signal and the address designation signal to the third input terminal 14 to transmission of information outputted from each of the memory chips to the output terminal 17.

As a result, it is not necessary to provide the semiconductor module 1 with a control circuit that controls so that the information output times become substantially the same. Moreover, since the information output times are substantially the same, it is possible, when reading information from the semiconductor module 1 on the circuit board 50, to read at the same timing whichever one of the memory chips the information is outputted from.

In this embodiment, the number of the semiconductor devices 5 mounted on the board 4 is four, but it may be five or more, and may be two or three. In these cases, the semiconductor module 1 is formed so that the plurality of semiconductor devices 5 are stacked in the same manner as mentioned before. Consequently, it is possible to realize the semiconductor module 1 such that the plurality of semiconductor devices 5 are stacked.

Further, in this embodiment, various terminals such as the first input terminal 12 and the output terminal 17 are disposed on the board 4, but positions to dispose the respective terminals are not limited to the positions as shown above. The respective terminals can be disposed so that the sum of the input wiring length and the output wiring length in each of the semiconductor devices 5a to 5d becomes a substantially fixed length.

Further, in this embodiment, the four semiconductor devices 5 are stacked, but the respective semiconductor devices 5a to 5d may be stacked two by two in two spots, and moreover, a stacking method is not restricted. In this case, it is possible to realize the semiconductor module 1 that is lower in height than the semiconductor module with the four semiconductor devices 5 stacked.

Further, in this embodiment, the input signal line 7 and the output signal line 8 are formed by single electric wirings, respectively, but the input signal line 7 and the output signal line 8 may be formed including a plurality of electric wirings as mentioned before. In this case, it is realized by disposing the mounting input terminals 10, the mounting output terminals 11 and the like corresponding to the respective electric wirings.

Further, in this embodiment, the input signal line 7 and the output signal line 8 are formed on the one surface portion 27 and the internal portion of the board 4, but they may be formed on the other surface portion 28 of the board 4.

In accordance with the semiconductor module 1 according to this embodiment, the semiconductor module 1 includes the plurality of semiconductor devices 5, and the semiconductor devices 5 are mounted on the board 4. The input signal line 7 of the electric wirings is electrically and mechanically connected to the respective semiconductor devices 5a to 5d. Consequently, it is possible to transmit signals inputted to the input signal line 7 to each of the semiconductor devices 5a to 5d. The output signal line 8 of the electric wirings is electrically and mechanically connected to each of the semiconductor devices 5a to 5d mentioned above. Consequently, it is possible to transmit signals outputted from the respective semiconductor devices 5a to 5d via the output signal line 8. Therefore, it is possible to output signals from the respective semiconductor devices 5a to 5d with the same wiring. Furthermore, the sum of the first line length of the input signal line 7 and the second line length of the output signal line for each of the semiconductor devices is set to a substantially fixed length. Consequently, the sum of a time for transmitting signals to each of the semiconductor devices 5a to 5d via the input signal line 7 and a time for transmitting signals from each of the semiconductor devices 5a to 5d via the output signal line 8 can be substantially made fixed.

As a result, the sum of the first length of the input signal line 7 and the second line length of the output signal line 8 for each of the semiconductor devices is set to a substantially fixed length, so that whichever one of the plurality of semiconductor devices 5a to 5d signals are inputted to, the sum of a time for transmitting to each of the semiconductor devices 5a to 5d via the input signal line 7 and a time for transmitting from each of the semiconductor devices 5a to 5d via the output signal line 8 is substantially the same. Consequently, a transmission delay time of signals depends on only a processing time of each of the semiconductor devices 5a to 5d. The transmission delay time is synonymous with a difference in transmission times of the semiconductor devices 5a to 5d in the case of transmission via the different semiconductor devices 5a to 5d. Therefore, the semiconductor module 1 of the invention can make the transmission delay time smaller than a conventional semiconductor module.

Consequently, it is possible to realize the highly convenient semiconductor module 1 that is capable of inhibiting a reading error resulting from the transmission delay time from occurring at the time of reading signals outputted from the output signal line 8. Moreover, since occurrence of the reading error as described before is inhibited, it is not necessary to design a complicated circuit for changing timing for reading signals. Accordingly, it is possible to simplify the circuit of the semiconductor module 1, and it is possible to promote reduction of the cost of manufacture.

Further, in accordance with the semiconductor module 1 according to this embodiment, the board 4 is a flexible board that has flexibility and can be folded, so that it is possible to fold the board 4 with flexibility thereof. The board 4 is provided with the pair of external connecting means 6 electrically connected to the input signal line 7 and the output signal line 8. Therefore, it is possible to transmit signals inputted to the input-side external connecting means 6a to the respective semiconductor devices 5a to 5d. Moreover, it is possible to transmit signals outputted from the respective semiconductor devices 5a to 5d to the output-side external connecting means 6b. Besides, the board 4 is further provided with the internal connecting means 9 for electrically connecting the pair of external connecting means 6 to each other. Consequently, it is possible to transmit signals inputted to the input-side external connecting means 6a to the output-side external connecting means 6b.

Consequently, it is possible to fold the board 4. As a result, a mounting area of the semiconductor module 1 can be smaller than a mounting area of the semiconductor module 1 in an unfolded state. The mounting area is synonymous with the area of a surface that faces the circuit board 50 in the case of mounting the semiconductor module 1 on the circuit board 50. Moreover, it is possible to reduce the mounting area by stacking the plurality of semiconductor devices 5 and thereby forming the stacked-type semiconductor module 1, for example.

Further, the pair of external connecting means 6 are electrically connected to each other by the internal connecting means 9. Consequently, it is possible to transmit signals inputted to the input-side external connecting means 6a to the output-side external connecting means 6b. Therefore, for example, at the time of forming the stacked-type semiconductor module 1 as described before, it is possible to electrically connect a pair of electrodes to each other via the internal connecting means 9 in specific. As a result, it is possible to electrically connect the pair of electrodes with ease.

Further, in accordance with the semiconductor module 1 according to this embodiment, the board 4 is provided with the mounting input terminal 10, the mounting output terminal 11, the first input terminal 12, the second input terminal 13, the third input terminal 14 and the output terminal 17. The first line length of the input signal line 7 is a wiring length from the third input terminal 14 to the mounting input terminal 10 via the second input terminal 13 and the first input terminal 12. The second line length of the output signal line 8 is a wiring length from the mounting output terminal 11 to the output terminal 17. Moreover, the semiconductor module 1 is capable of inputting signals to the third input terminal 14. Furthermore, the semiconductor module 1 is capable of outputting signals from the output terminal 17. Therefore, signals inputted from the third input terminal 14 are guided to the respective semiconductor devices 5a to 5d via the second input terminal 13, the first input terminal 12, and the mounting input terminal 10. Moreover, signals outputted from the respective semiconductor devices 5a to 5d are guided to the output terminal 17 via the mounting output terminal 11. Besides, the sum of the first line length and the second line length in each of the semiconductor devices 5a to 5d is set to a substantially fixed length. Therefore, the sum of a time for guiding signals inputted to the third input terminal 14 to each of the semiconductor devices 5a to 5d and a time for guiding signals outputted to the output terminal 17 from each of the semiconductor devices 5a to 5d can be substantially made fixed.

Consequently, the transmission delay time for each of the semiconductor devices 5a to 5d depends on only a difference in processing times of the respective semiconductor devices 5a to 5d. Therefore, the semiconductor module 1 of the invention is capable of making the transmission delay time smaller than the conventional semiconductor module. As a result, at the time of reading signals outputted from the output signal line, it is possible to realize the highly convenient semiconductor module 1 that is capable of inhibiting occurrence of the reading error resulting from the transmission delay time. Moreover, it is not necessary to design a complicated circuit for changing a time interval for reading signals in order to inhibit occurrence of the reading error as described before.

Further, in accordance with the semiconductor module 1 according to this embodiment, the termination resistance board 40 is electrically and mechanically connected to the input signal line 7 and the output signal line 8, respectively. Thus, it is possible to reduce reflection of signals at the termination portions of the input signal line 7 and the output signal line 8.

Consequently, it is possible to reduce reflection of signals occurring at the respective termination portions of the input signal line 7 and the output signal line 8. In particular, it is possible to reduce reflection of signals that outstandingly occurs at the time of transmitting high-frequency signals to the respective semiconductor devices 5a to 5d. As a result, it is possible to inhibit that, at the time of transmitting high-frequency signals with the input signal line 7 and the output signal line 8, the high-frequency signals are disturbed by reflected signals.

Further, in accordance with the semiconductor module 1 according to this embodiment, the third input terminal 14 and the output terminal 17 are formed so that they can be mounted on the circuit board 50 via the external connecting means 6. Consequently, the third input terminal 14 and the output terminal 17 can be electrically connected to the circuit board 50 via the external connecting means 6. Therefore, it is possible to input signals from the circuit board 50 to the third input terminal 14. Moreover, it is possible to output signals from the output terminal 17 to the circuit board 50.

As a result, it is possible to electrically connect the circuit board 50 and the third input terminal 14 via the external connecting means 6. Therefore, it is possible to transmit signals from the circuit board 50 to the respective semiconductor devices 5a to 5d via the external connecting means 6. Moreover, it is possible to electrically connect the circuit board 50 and the output terminal 17 via the external connecting means 6. Therefore, it is possible to output signals from the respective semiconductor devices 5a to 5d to the circuit board 50 via the external connecting means 6. Thus, the highly convenient semiconductor module 1 can be realized.

Further, in accordance with the semiconductor module 1 according to this embodiment, in the mounting step, the plurality of semiconductor devices 5 are mounted on the flexible board 4. In the folding step, the board 4 is folded. At the time of folding the flexible board 4 in the folding step, the board 4 is folded so that the sum of the first line length of the input signal line 7 and the second line length of the output signal line 8 for each of the semiconductor devices becomes a substantially fixed length. By going through these steps, it is possible to realize the semiconductor module 1 such that the plurality of semiconductor devices 5 are mounted on the board 4 and the first line length of the input signal line 7 and the second line length of the output signal line 8 where the respective semiconductor devices 5a to 5d are electrically and mechanically connected are substantially fixed lengths.

As a result, it is possible to easily realize the semiconductor module 1 such that the plurality of semiconductor devices 5 are mounted on the board 4 and the sum of the first line length of the input signal line 7 and the second line length of the output signal line 8 of each of the semiconductor devices 5a to 5d mounted on the board 4 becomes a substantially fixed length.

Further, in accordance with the semiconductor module 1 according to this embodiment, in the circuit board mounting step, it is possible to mount the semiconductor module 1 on the circuit board 50. Consequently, it is possible to realize mounting of the semiconductor module such that the first line length of the input signal line 7 and the second line length of the output signal line 8 are substantially fixed lengths on the circuit board 50.

As a result, it is possible to mount the semiconductor module 1 such that the first line length of the input signal line 7 and the second line length of the output signal line 8 are substantially fixed lengths on the circuit board 50.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor module comprising:
a board provided with electric wirings including a input signal line and a output signal line; and
a plurality of semiconductor devices mounted on the board,
the plurality of semiconductor devices being arranged in a line in a longitudinal direction of the board and the plurality of semiconductor devices being connected in parallel with each other between the input signal line and the output signal line,
the input signal line being electrically and mechanically connected to each of the semiconductor devices mounted on the board, and the output signal line being electrically and mechanically connected to each of the semiconductor devices, and a sum of a first line length of the input signal line and a second line length of the output signal line for each of the semiconductor devices being set to a substantially fixed length, the semiconductor module further comprising:

a termination resistance board;

input-side termination resistance connecting means, and an output-side termination resistance connecting means, the termination resistance board being provided with an input-side termination resistance terminal and an output-side termination resistance terminal; and the input-side termination resistance terminal being connected to an input-side termination terminal of the input signal line via the input-side termination resistance connecting means, and the output-side termination resistance terminal being connected to an output-side termination terminal of the output signal line via the output-side termination resistance connecting means.

2. The semiconductor module of claim 1, wherein the board is a flexible board that has flexibility and can be folded; and the board is further provided with internal connecting means for electrically connecting a pair of electrodes to be placed on the flexible board to each other.

3. The semiconductor module of claim 2, wherein the board has:

mounting input terminals for inputting signals to the semiconductor devices;

mounting output terminals to which signals are outputted from the semiconductor devices;

a first input terminal disposed on one surface portion of the board;

a second input terminal disposed on another surface portion of the board, the second input terminal being electrically connected to the first input terminal via the internal connecting means;

a third input terminal disposed on the board, the third input terminal penetrating through the board in a thickness direction thereof to be electrically connected to the second input terminal; and an output terminal disposed on the board, wherein the first line length of the input signal line is a wiring length from the third input terminal to the mounting input-terminal through the second input terminal and the first input terminal, and the second line length of the output signal line is a wiring length from the mounting output terminal to the output terminal.

4. The semiconductor module of claim 1, wherein the termination resistance board is capable of reducing reflection of signals.

5. The semiconductor module of claim 3, wherein the third input terminal and the output terminal are formed so that they can be mounted on a circuit board via external connecting means.

* * * * *